(12) United States Patent
Kimura

(10) Patent No.: US 7,355,445 B2
(45) Date of Patent: Apr. 8, 2008

(54) DIGITAL CIRCUIT WITH SMALLER AMPLITUDE OF INPUT SIGNAL VOLTAGE THAN AMPLITUDE OF POWER SOURCE VOLTAGE OF THE DIGITAL CIRCUIT

(75) Inventor: Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 41 days.

(21) Appl. No.: 10/732,113

(22) Filed: Dec. 10, 2003

(65) Prior Publication Data
US 2004/0257117 A1  Dec. 23, 2004

(30) Foreign Application Priority Data
Dec. 13, 2002  (JP) ............... 2002-362148

(51) Int. Cl.
*H03K 19/0175* (2006.01)
(52) U.S. Cl. .................................. 326/81; 326/83
(58) Field of Classification Search ................. 326/81, 326/80, 83, 86–87
See application file for complete search history.

(56) References Cited

U.S. PATENT DOCUMENTS

| | | | | |
|---|---|---|---|---|
| 4,797,579 A * | 1/1989 | Lewis | ............... | 326/27 |
| 4,827,159 A | 5/1989 | Naganuma | ............... | 326/27 |
| 4,877,980 A * | 10/1989 | Kubinec | ............... | 327/110 |
| 5,128,560 A * | 7/1992 | Chern et al. | ............... | 326/81 |
| 5,378,943 A * | 1/1995 | Dennard | ............... | 326/68 |
| 5,426,383 A * | 6/1995 | Kumar | ............... | 326/119 |
| 5,523,707 A * | 6/1996 | Levy et al. | ............... | 326/52 |
| 5,808,480 A * | 9/1998 | Morris | ............... | 326/81 |
| 5,929,679 A | 7/1999 | Ohwada | ............... | 327/206 |
| 6,166,580 A * | 12/2000 | Sessions | ............... | 327/333 |
| 6,242,951 B1 * | 6/2001 | Nakata et al. | ............... | 326/98 |
| 6,304,120 B1 * | 10/2001 | Taito | ............... | 327/170 |
| 6,335,637 B1 * | 1/2002 | Correale et al. | ............... | 326/80 |
| 6,972,594 B2 * | 12/2005 | Yu | ............... | 326/68 |
| 2002/0008689 A1 | 1/2002 | Koyama et al. | ............... | 345/100 |

FOREIGN PATENT DOCUMENTS

| | | |
|---|---|---|
| JP | 63-005553 | 1/1988 |
| JP | 01-261923 | 10/1989 |
| JP | 05-235741 | 9/1993 |
| JP | 05-308273 | 11/1993 |

(Continued)

*Primary Examiner*—James H. Cho
(74) *Attorney, Agent, or Firm*—Cook, Alex, McFarron, Manzo, Cummings & Mehler, Ltd.

(57) ABSTRACT

In order to provide a semiconductor device having a circuit for operating normally even when the amplitude of a signal voltage is smaller than the amplitude of a power source voltage, a correcting circuit is provided before a digital circuit to be operated normally. As for a signal outpuffed from the correcting circuit, when a transistor in the objective digital circuit is required to be turned OFF, the correcting circuit outputs a corresponding signal, namely a first power source potential. At this time, the transistor is turned OFF. On the other hand, when the transistor is required to be turned ON, the correcting circuit outputs a first input potential. Consequently, the objective digital circuit is turned OFF when it is required to be in an OFF state while turned ON when it is required to be in an ON state. Thereby, the objective digital circuit can be normally operated.

14 Claims, 15 Drawing Sheets

FOREIGN PATENT DOCUMENTS

| | | |
|---|---|---|
| JP | 06-152381 | 5/1994 |
| JP | 09-172367 | 6/1997 |
| JP | 09-257839 | 10/1997 |
| JP | 11-163713 | 6/1999 |
| JP | 2002-118458 | 4/2002 |

* cited by examiner

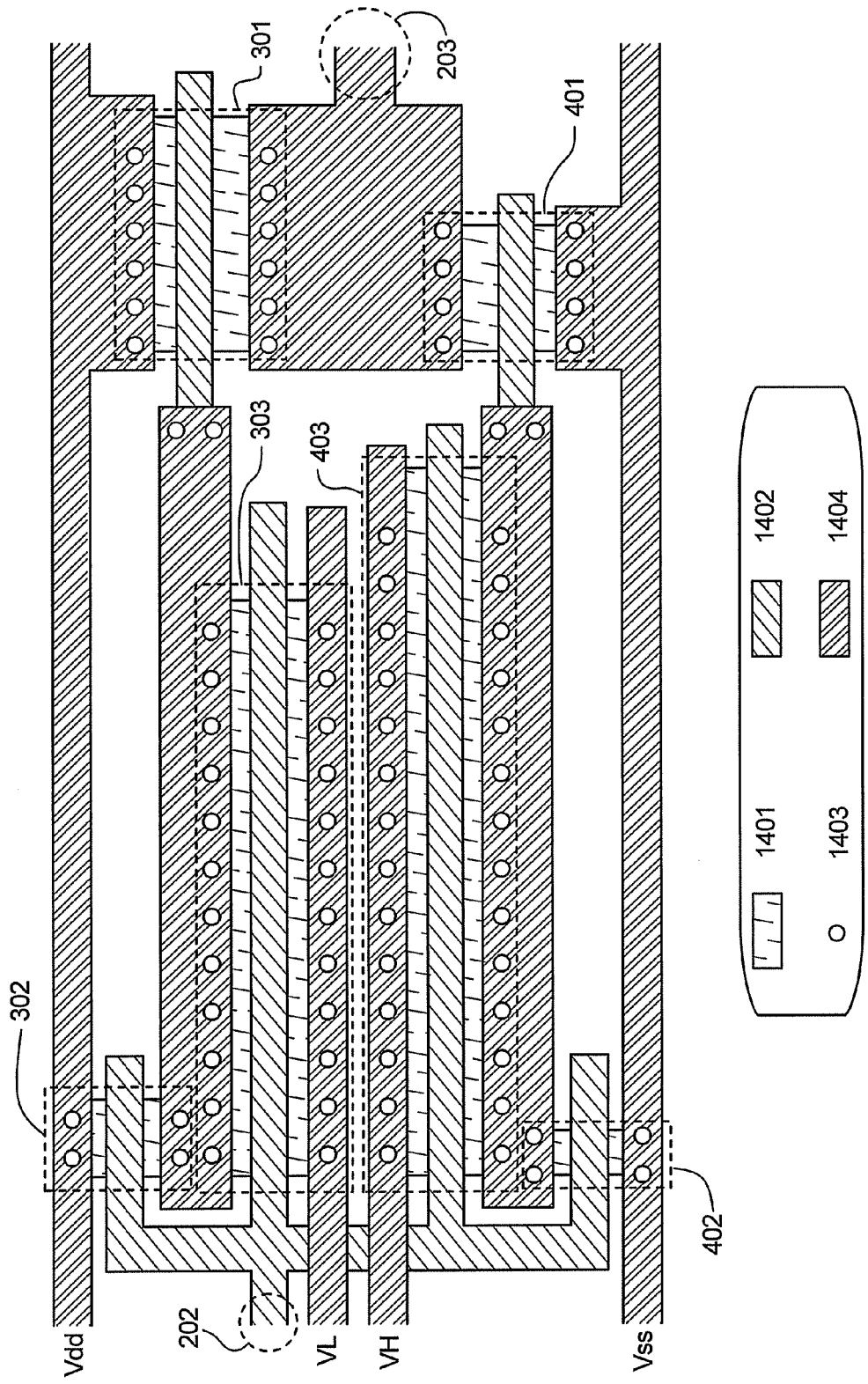

DIGITAL CIRCUIT WITH SMALLER AMPLITUDE OF INPUT SIGNAL VOLTAGE THAN AMPLITUDE OF POWER SOURCE VOLTAGE OF THE DIGITAL CIRCUIT

TECHNICAL FIELD

The present invention relates to a digital circuit which operates based on a digital signal, and more particularly to a semiconductor device having one or a plurality of the digital circuits in the case where the amplitude of a signal voltage of an input signal is smaller than the amplitude of a power source voltage of the digital circuit.

BACKGROUND OF THE INVENTION

A logical circuit processing a digital signal (hereinafter referred to as a digital circuit) is configured with a single or a plurality of logic elements as a basic unit. The logic element is a circuit which provides one output corresponding to a single input or a plurality of inputs. The logic elements correspond to an inverter, an AND, an OR, a NOT, a NAND, a NOR, a clocked inverter, and a transmission gate (analog switch) and the like, for example.

The logic element is configured with a single circuit element or a plurality of circuit elements such as transistors, resistors and capacitor elements. By operating each of the plurality of circuit elements in accordance with a digital signal inputted to the logic element, a signal potential or a current which is to be supplied to a subsequent circuit is controlled.

Given as an example is an inverter as one of the logic elements. A configuration and operation thereof are explained concretely.

A circuit diagram of a general inverter is shown in FIG. 16. In FIG. 16, IN means an inputted signal (input signal), and OUT means an outputted signal (output signal). Further, VDD and VSS mean power source potentials and VDD>VSS is satisfied.

The inverter shown in FIG. 16 includes a p-channel type TFT 1301 and an n-channel type TFT 1302. A gate (G) of the p-channel type TFT 1301 and a gate of the n-channel type TFT 1302 are connected to each other, and the input signal IN is inputted to these two gates. In addition, VDD is supplied to a first terminal of the p-channel type TFT 1301, and VSS is supplied to a first terminal of the n-channel type TFT 1302. Further, a second terminal of the p-channel type TFT 1301 and a second terminal of the n-channel type TFT 1302 are connected to each other and the output signal OUT is outputted from these two second terminals to a subsequent circuit.

Note that, either of the first terminal or the second terminal corresponds to a source and the other corresponds to a drain. In the case of a p-channel type TFT, a terminal having a higher potential is a source and a terminal having a lower potential is a drain, and in the case of an n-channel type TFT, a terminal having a lower potential is a source and a terminal having a higher potential is a drain. Therefore, the first terminals of the TFTs correspond to sources (S) and the second terminals thereof correspond to drains (D) in FIG. 16.

Generally, for an input signal, a digital signal having binary potentials is utilized. Two circuit elements of the inverter operate in accordance with a potential of the input signal IN, thereby controlling a potential of the output signal OUT.

When VDD or VSS is inputted as the input signal IN, the potential of the output signal OUT becomes VSS or VDD respectively, in which the signal logic is inverted.

Even in the case where VDD' or VSS' each having the amplitude larger than the amplitude of the power source voltage is inputted as the input signal IN, each circuit element operates similarly to the case where VDD or VSS is inputted and the potential of the output signal OUT becomes VSS or VDD respectively so that an output signal OUT having a desired potential can be obtained.

In this manner, each circuit element operates in accordance with the potential of the input signal IN generally, thereby controlling the potential of the output signal OUT.

However, in the case where VDD' or VSS' each having the amplitude smaller than the amplitude of the power source voltage is inputted as the input signal IN, each circuit element does not operate normally, so that a desired output signal may not be obtained.

Hereinafter verified are operations of an inverter in the case where it is assumed that binary potentials of the input signal IN, VDD' and VSS', satisfy VDD' <VDD and VSS'>VSS respectively. Note that VSS'<VDD' is satisfied.

First, FIG. 16A shows an operating state of each circuit element in the case where the input signal IN has a potential on the high potential side VDD'(VDD'<VDD). Here, it is assumed to simplify the explanation that a threshold voltage $V_{THn}$ of an n-channel type TFT satisfies $V_{THn} \geq 0$ and a threshold voltage $V_{THp}$ of a p-channel type TFT satisfies $V_{THp} \leq 0$.

When the potential on the high potential side VDD' is inputted as the input signal IN, a gate-source voltage $V_{GS}$ of the n-channel type TFT 1302 becomes (VDD'-VSS)>0. (VDD'-VSS) is higher than the threshold voltage $V_{THn}$ of the n-channel type TFT 1302 generally, thus the n-channel type TFT 1302 is turned ON.

On the other hand, when the potential on the high potential side VDD' is inputted as the input signal IN, a gate-source voltage $V_{GS}$ of the p-channel type TFT 1301 satisfies (VDD'-VDD)<0. In the case where the gate-source voltage $V_{GS}$ of the p-channel type TFT 1301 is equal to or higher than the threshold voltage $V_{THp}$ of the p-channel type TFT 1301, the p-channel type TFT 1301 is turned OFF and consequently, a potential VSS supplied to the n-channel type TFT 1302 is outputted so that signal logic is inverted. However, in the case where the gate-source voltage $V_{GS}$ of the p-channel type TFT 1301 is lower than the threshold voltage $V_{THp}$ of the p-channel type TFT 1301, the p-channel type TFT 1301 is turned ON. Because the gate-source voltage $V_{GS}$ satisfies (VDD'-VDD)<0 and the threshold voltage satisfies $V_{THp} \leq 0$, in case that the absolute values of them are compared with each other, when $|V_{GS}| \leq |V_{THp}|$, the p-channel type TFT 1301 is turned OFF while when $|V_{GS}|>|V_{THp}|$, that is |VDD'-VDD|>|V_{THp}|$, the p-channel type TFT 1301 is turned ON.

As mentioned above, when the potential VDD' is supplied to a gate of the p-channel type TFT 1301, the gate-source voltage satisfies $V_{GS}<0$ because VDD'<VDD is satisfied. Therefore, when $|V_{GS}|>|V_{THp}|$, that is |VDD'-VDD|>|V_{THp}|$, the p-channel type TFT 1301 is turned ON.

Therefore, both the p-channel type TFT 1301 and the n-channel type TFT 1302 are turned ON depending on values of VDD, VDD', and $V_{THp}$. In this case, a potential of an output signal OUT does not become VSS even in the case where an input signal has a potential on the high potential side VDD'.

A potential of the output signal OUT when both the p-channel type TFT 1301 and the n-channel type TFT 1302 are turned ON is determined by the current flowing in each transistor, that is on-resistance (or a source-drain voltage). In FIG. 16A with an input signal of a potential on the high potential side VDD', when $V_{GS}$ of the n-channel type transistor TFT is referred to as $V_{GSn}$ and $V_{GS}$ of the p-channel type TFT is referred to as $V_{GSp}$, $|V_{GSn}|>|V_{GSp}|$. Therefore, the potential of the output signal OUT approaches closer to VSS than VDD when there is almost no difference between transistors as to the characteristics and a ratio of a channel width W to a channel length L. However, the potential of the output signal OUT can approach closer to VDD than VSS depending on the mobility, the threshold voltage, and the ratio of the channel width to the channel length of each TFT. In this case, the digital circuit does not operate normally, leading to a high possibility of malfunction. Further, it may cause a sequential malfunction in the subsequent digital circuit.

FIG. 16B shows an operating state of each circuit element in the case where the input signal IN has a potential on the low potential side VSS' (VSS'>VSS). It is assumed to simplify the explanation that a threshold voltage of the n-channel type TFT $V_{THn}$ satisfies $V_{THn} \geqq 0$ and a threshold voltage of the p-channel type TFT $V_{THp}$ satisfies $V_{THp} \leqq 0$.

When the potential on the low potential side VSS' is inputted as the input signal IN, a gate-source voltage $V_{GS}$ of the p-channel type TFT 1301 becomes (VSS'-VDD)<0. (VSS'-VDD) is lower than the threshold voltage $V_{THp}$ of the p-channel type TFT 1301 generally, thus the p-channel type TFT 1301 is turned ON.

On the other hand, when the potential on the low potential side VSS' is inputted as the input signal IN, a gate-source voltage $V_{GS}$ of the n-channel type TFT 1302 satisfies (VSS'-VSS)>0. In the case where the gate-source voltage $V_{GS}$ of the n-channel type TFT 1302 is equal to or lower than the threshold voltage $V_{THn}$ of the n-channel type TFT 1302, the n-channel type TFT 1302 is turned OFF. Consequently, a potential VDD supplied to the p-channel type TFT 1301 is outputted, so that signal logic is inverted. However, in the case where the gate-source voltage $V_{GS}$ of the n-channel type TFT 1302 is higher than the threshold voltage $V_{THn}$ of the n-channel type TFT 1302, the n-channel type TFT 1302 is turned ON. Because the gate-source voltage $V_{GS}$ satisfies (VSS'-VSS)>0 and the threshold voltage satisfies $V_{THn} \geqq 0$, in case that the absolute values of them are compared with each other, when $|V_{GS}| \leqq |V_{THn}|$, the n-channel type TFT 1302 is turned OFF while when $|V_{GS}|>|V_{THn}|$, that is |VSS'-VSS|>|$V_{THn}$|, the n-channel type TFT 1302 is turned ON.

As mentioned above, when the potential VSS' is supplied to a gate of the n-channel type TFT 1302, the gate-source voltage satisfies $V_{GS}>0$ because VSS'>VSS is satisfied. Therefore, when $|V_{GS}|>|V_{THn}|$, that is |VSS'-VSS|>|$V_{THn}$|, the n-channel type TFT 1302 is turned ON.

Therefore, both the p-channel type TFT 1301 and the n-channel type TFT 1302 are turned ON depending on values of VSS, VSS', and $V_{THn}$. In this case, a potential of an output signal OUT does not become VDD even in the case where an input signal has a potential on the low potential side VSS'.

A potential of the output signal OUT when both the p-channel type TFT 1301 and the n-channel type TFT 1302 are turned ON is determined by the current flowing in each transistor, that is on-resistance (or a source-drain voltage). In FIG. 16B with an input signal of a potential on the low potential side VSS', $|V_{GSn}|<|V_{GSp}|$ is satisfied. Therefore, the potential of the output signal OUT approaches closer to VDD than VSS when there is almost no difference between transistors as to the characteristics and a ratio of a channel width W to a channel length L. However, the potential of the output signal OUT may approach closer to VSS than VDD depending on the mobility, the threshold voltage, and the ratio of the channel width W to the channel length L of each TFT. In this case, the digital circuit does not operate normally, leading to a high possibility of malfunction. Further, it may cause a sequential malfunction in the subsequent digital circuit.

As described above, in the inverters shown in FIG. 16, an output signal OUT having a desired potential is obtained when the binary potentials VDD' and VSS' of the input signal IN satisfy that VDD'≧VDD and VSS'≦VSS respectively, thereby a normal operation is obtained. However, when the binary potentials VDD' and VSS' of the input signal IN satisfy that VDD'<VDD and VSS'>VSS respectively, the output signal OUT having a desired potential is not obtained, thereby the inverter may not operate normally.

The above is not exclusively limited to the inverter, but can be applied to other digital circuits. That is, when binary potentials of an input signal are out of the predetermined range, the circuit elements of the digital circuit malfunction. Therefore, an output signal OUT having a desired potential can not be obtained and the digital circuit does not function normally.

A potential of the input signal supplied from a circuit of a prior stage or a wiring is not always such a value as to operate the digital circuit normally. In this case, by adjusting the potential of the input signal by a level shifter, the digital circuit can operate normally. However, a high-speed operation of the semiconductor device is frequently hindered by using the level shifter, because level shifters generally have disadvantages in that the speed of rising and falling of the potential of the output signal is slow as each of the circuit elements operates in conjunction such that an operation of one circuit element triggers the operations of other circuit elements.

In addition, the problem of increasing current consumption arises since the n-channel type TFT 1302 and the p-channel type TFT 1301 are simultaneously turned ON to flow a penetrating current.

In view of the above-described problems, it is an object of the present invention to provide a digital circuit which can operate normally regardless of binary potentials of an input signal. In more detail, it is an object to provide a digital circuit which can operate normally even in the case where the amplitude of an input signal is smaller than the amplitude of a power source voltage.

SUMMARY OF THE INVENTION

In order to solve the above problems, the invention utilizes a means described hereafter. The invention is a semiconductor device having a correcting means and a transistor. Provided is the semiconductor device in which the correcting means has an input terminal and an output terminal, the input terminal of the correcting means is inputted with either a first input potential or a second input potential, the correcting means has a means for outputting either a first power source potential or the first input potential to the output terminal in accordance with a potential inputted to the input terminal, and the output terminal of the correcting means is connected to a gate terminal of the transistor.

In other words, a correcting means is provided before a digital circuit to be operated normally. As for a signal outputted by the correcting means, in the case where a transistor in an objective digital circuit is to be in an OFF state, a corresponding signal, that is a first power source potential, is outputted from the correcting means. At that time, the transistor is turned OFF. On the other hand, in the case where the transistor is to be turned ON, a first input potential is outputted from the correcting means. Consequently, the objective digital circuit is turned OFF in the case where an OFF state is required while it is turned ON in the case where an ON state is required. The objective digital circuit, accordingly, can operate normally.

Furthermore, since the transistor is turned OFF when it is required to be turned OFF, the current can be prevented from continuously flowing due to a leak current. Therefore, power consumption can be reduced.

Here, FIG. 2 shows a configuration of a digital circuit of the invention. A digital circuit 201 has a correcting means 204 for correcting a potential of a signal inputted to an input terminal 202 and one or a plurality of circuit elements 205 each of whose operation is controlled by the inputted signal after corrected by the correcting means 204. The circuit element 205 corresponds to a digital circuit to be corrected. A signal is outputted from an output terminal 203 in accordance with the circuit element 205.

It is to be noted that the digital circuit 201 may have a plurality of the input terminals 202 and the output terminals 203. Similarly, the digital circuit 201 may have a plurality of the correcting means 204 and the circuit elements 205 as well.

The invention is a semiconductor device having a first transistor, a second transistor, and a third transistor. Provided is the semiconductor device which is characterized in that a gate terminal of the first transistor and a gate terminal of the second transistor are electrically connected, a source terminal of the first transistor is supplied with a first power source potential, a source terminal of the second transistor is supplied with a potential equal to a first signal potential, a drain terminal of the first transistor is electrically connected to a drain terminal of the second transistor, the drain terminal of the first transistor is electrically connected to a gate terminal of the third transistor, a source terminal of the third transistor is supplied with a second power source potential, and the gate terminal of the first transistor is supplied with one of the first signal potential and a second signal potential.

The invention also provides a semiconductor device characterized in that the conductivity types of the first transistor and the second transistor are different according to the above configuration.

The invention is a semiconductor device having a first transistor, a second transistor, and a third transistor. Provided is the semiconductor device which is characterized in that a gate terminal of the first transistor and a gate terminal of the second transistor are electrically connected, a drain terminal of the first transistor is electrically connected to a drain terminal of the second transistor, the drain terminal of the first transistor is electrically connected to a gate terminal of the third transistor, the gate terminal of the first transistor is supplied with one of a first signal potential and a second signal potential, a source terminal of the first transistor is supplied with a first power source potential, a source terminal of the second transistor is supplied with a potential equal to the first signal potential, a source terminal of the third transistor is supplied with a second power source potential, the first transistor and the third transistor are p-channel type transistors, the second transistor is an n-channel type transistor, the first power source potential and the second power source potential are power source potentials on the high potential side, the first signal potential is a potential on the low potential side, and the second signal potential is a potential on the high potential side.

The invention is a semiconductor device having a first transistor, a second transistor, and a third transistor. Provided is the semiconductor device which is characterized in that a gate terminal of the first transistor and a gate terminal of the second transistor are electrically connected, a drain terminal of the first transistor is electrically connected to a drain terminal of the second transistor, the drain terminal of the first transistor is electrically connected to a gate terminal of the third transistor, the gate terminal of the first transistor is supplied with one of a first signal potential and a second signal potential, a source terminal of the first transistor is supplied with a first power source potential, a source terminal of the second transistor is supplied with a potential equal to the first signal potential, a source terminal of the third transistor is supplied with a second power source potential, the first transistor and the third transistor are n-channel type transistors, the second transistor is a p-channel type transistor, the first power source potential and the second power source potential are power source potentials on the low potential side, the first signal potential is a potential on the high potential side, and the second signal potential is a potential on the low potential side.

Note that a transistor in the invention may be a transistor manufactured by any materials, means, and manufacturing methods and any types of transistors may be used. For example, a thin-film transistor (TFT) may be used. The TFT may use any of amorphous, polycrystal and singlecrystal semiconductor layer. As another transistor, the transistor may be manufactured using a singlecrystal substrate, a transistor using an SOI substrate, a transistor formed over a plastic substrate, and a transistor formed over a glass substrate. Besides, the transistor may be formed of an organic material or carbon nano-tube. Furthermore, MOS transistors or bipolar transistors are also applicable.

Note that, connection means an electrical connection in the invention. Therefore, other elements and the like may be interposed therebetween.

According to the above configuration, the digital circuit can operate normally even in the case where the amplitude of an input signal is smaller than the amplitude of a power source voltage.

BRIEF DESCRIPTION OF DRAWINGS

FIG. 14 is a view showing a layout of a circuit in which the invention is applied to an inverter.

DETAILED DESCRIPTION OF THE PRESENTLY PREFERRED EMBODIMENTS

Embodiment Mode 1

Described in this embodiment mode are specific configurations and operations of a correcting means 204 and a circuit element 205 to be corrected which configure a digital circuit 201.

Figure 3:
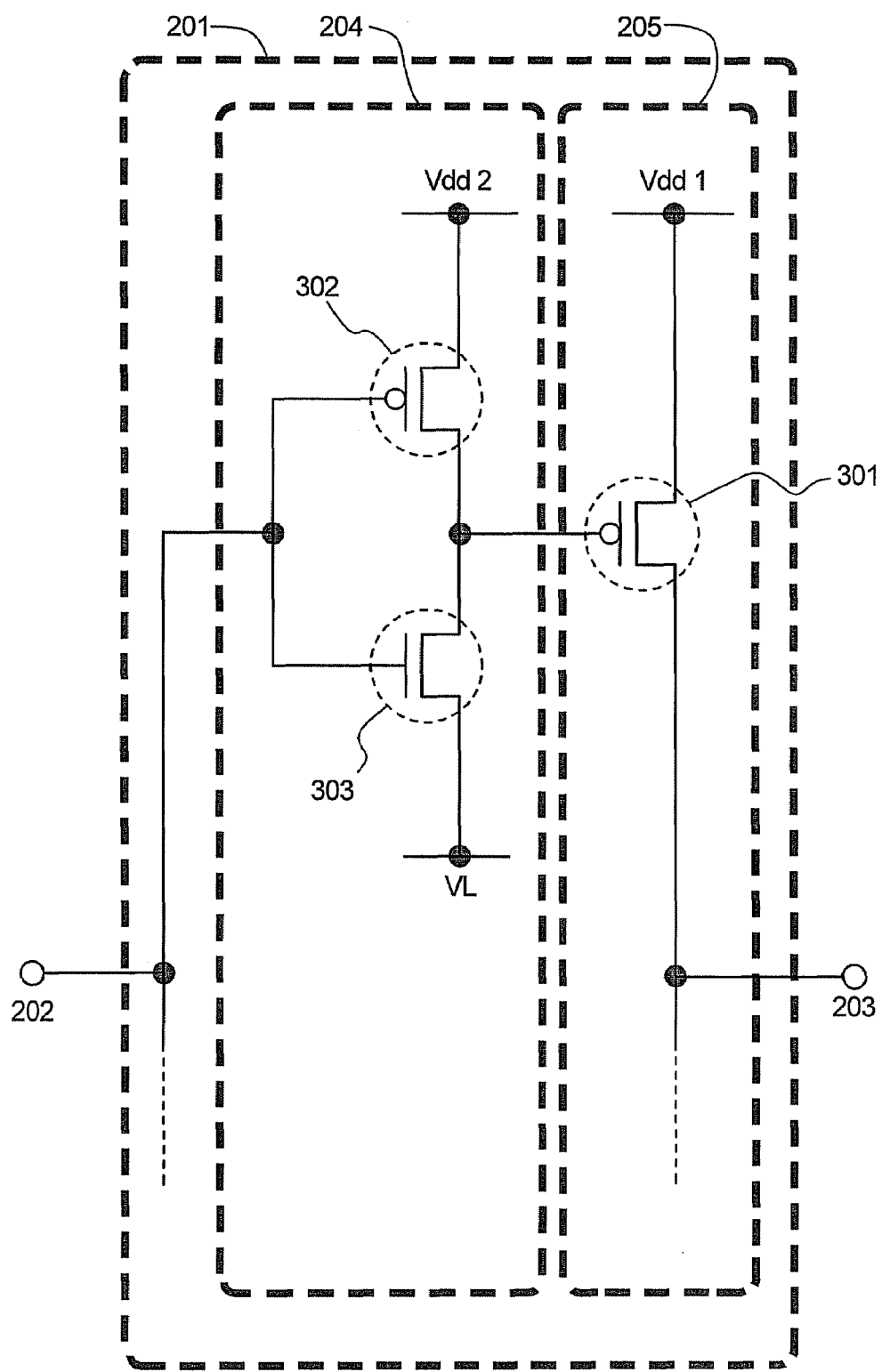
FIG. 3 is a diagram showing a configuration of a digital circuit of the invention.

FIG. 3 shows a simple configuration example of the correcting means 204 in the case where the polarity of a transistor 301 configuring the circuit element 205 to be corrected is a p-channel type.

The digital circuit 201 includes the correcting means 204 for correcting a potential of a signal inputted to an input terminal 202 and the circuit element 205 whose operation is controlled by an input signal corrected by the correcting means 204. Then, a signal is outputted from an output terminal 203 in accordance with the operation of the circuit element 205. The correcting means 204 is configured with an inverter circuit.

The input terminal 202 is inputted with one of an input potential on the high potential side VH and an input potential on the low potential side VL as an input signal. It is assumed that the input potential on the high potential side VH is a potential equal to or lower than a power source potential on the high potential side (Vdd, Vdd1, Vdd2, and the like) and the input potential on the low potential side VL is a potential equal to or higher than a power source potential on the low potential side (Vss, Vss1, Vss2, and the like).

It is to be noted that, in the case of an input value of 1 (H signal), the input potential on the high potential side VH is inputted and in the case of an input value of 0 (L signal), the input potential on the low potential side VL is inputted, though it is not limited to this.

A source terminal of the transistor 301 configuring the circuit element 205 to be corrected is connected to the power source on the high potential side Vdd1 and a drain terminal thereof is connected to the output terminal 203. A gate terminal of the transistor 301 is connected to an output terminal of the correcting means 204. The correcting means 204 is configured with the inverter circuit. A source terminal of an n-channel type transistor 303 configuring the inverter is connected to a potential equal to or approximately equal to the input potential on the low potential side VL. A gate terminal of the n-channel type transistor 303 is connected to the input terminal 202 and a drain terminal thereof is connected to the gate terminal of the transistor 301 as the output terminal of the correcting means 204. A source terminal of a p-channel type transistor 302 configuring the inverter is connected to the power source on the high potential side Vdd2. A gate terminal of the p-channel type transistor 302 is connected to the input terminal 202 and a drain terminal thereof is connected to the gate terminal of the transistor 301 as the output terminal of the correcting means 204.

Operation of the digital circuit 201 in FIG. 3 is described next.

In the case where the input terminal 202 is inputted with the input potential on the low potential side VL, a gate-source voltage of the n-channel type transistor 303 is 0V or approximately 0V. Assuming that a threshold voltage of the n-channel type transistor 303 is 0V or more, the n-channel type transistor 303 is turned OFF in this case. On the other hand, a gate-source voltage of the p-channel type transistor 302 is applied with (VL-Vdd2). The gate-source voltage (VL-Vdd2) of the p-channel type transistor 302 is smaller than a threshold voltage of the p-channel type transistor 302 generally, thus the p-channel type transistor 302 is turned ON. Consequently, the power source on the high potential side Vdd2 is applied to the gate of the transistor 301. In this case, when a gate-source voltage of the transistor 301 (Vdd2-Vdd1) is larger than a threshold voltage of the transistor 301, the transistor 301 is turned OFF. That is, in the case where the input potential on the low potential side VL is inputted to the input terminal 202, the transistor 301 is turned OFF.

In the case where the input terminal 202 is inputted with the input potential on the high potential side VH, a gate-source voltage of the n-channel type transistor 303 is (VH-VL). Therefore, (VH-VL) is larger than a threshold voltage of the n-channel type transistor 303 generally, thus the n-channel type transistor 303 is turned ON. On the other hand, a gate-source voltage of the p-channel type transistor 302 is (VH-Vdd2). In the case where (VH-Vdd2) is larger than a threshold voltage of the p-channel type transistor 302, the p-channel type transistor 302 is turned OFF. Consequently, VL is applied to the gate of the transistor 301 and the transistor 301 is turned ON. That is, in the case where the input potential on the high potential side VH is inputted to the input terminal 202, the transistor 301 is turned ON to output the power source on the high potential Vdd1.

It is to be noted that in the case where the gate-source voltage (VH-Vdd2) of the p-channel type transistor 302 is smaller than the threshold voltage of the p-channel type transistor 302, the p-channel type transistor 302 is turned ON. The n-channel type transistor 303 is also turned ON in this case, therefore, a potential to be applied to the gate terminal of the transistor 301 is determined depending on on-resistance (or a source-drain voltage) of the p-channel type transistor 302 and the n-channel type transistor 303, so that it is a potential between Vdd2 and VL. In this case, the gate terminal of the transistor 301 is preferably applied with a potential that easily turns ON the transistor 301. In view of this, the on-resistance of the n-channel type transistor 303 is reduced as much as possible. Consequently, the gate terminal of the transistor 301 is applied with a potential closer to VL to turn ON the transistor 301.

As mentioned above, in the case where the input potential on the low potential side VL is inputted to the input terminal 202, the transistor 301 is turned OFF. On the other hand, in the case where the input potential on the high potential side VH is inputted to the input terminal 202, the transistor 301 is turned ON to output the power source on the high potential side Vdd1. That is, the transistor 301 is turned OFF when it is required to be turned OFF while turned ON when it is required to be turned ON. Accordingly, a normal operation can be realized.

In addition, since the transistor is turned OFF when it is required to be turned OFF, the current can be prevented from continuing flowing due to a leak current. Therefore, power consumption can be reduced. Since the correcting means 204 is configured with the inverter circuit, it is necessary to be careful in that this transistor 301 is inputted with an inverted signal of an input signal.

In order to set on-resistance of the n-channel type transistor 303 less than on-resistance of the p-channel type transistor 302, the current drive capability of the n-channel type transistor 303 is preferably improved. The current drive ability of a transistor is in proportion to W/L, that is the ratio of the gate width W to the gate length L. Therefore, the W/L of the n-channel type transistor 303 is preferably increased so as to be far larger than the W/L of the p-channel type transistor 302. Specifically, the W/L of the n-channel type transistor 303 is preferably increased so as to be five times as much as or more than five times the W/L of the p-channel type transistor 302.

In this manner, even in the case where the W/L of the n-channel type transistor 303 is increased, a serious side effect does not arise. For example, in the case where the input potential on the low potential side VL is inputted to the input terminal 202, the p-channel type transistor 302 is turned ON so that the power source on the high potential Vdd2 is applied to the gate of the transistor 301. Assuming that the n-channel type transistor 303 is not turned OFF at this time, a potential lower than the power source on the high potential side Vdd2 is applied to the gate of the transistor 301 because of small on-resistance of the n-channel type transistor 303, so that the transistor 301 may not turned OFF. However, in the case where the input potential on the low potential side VL is inputted to the input terminal 202, the n-channel type transistor 303 is turned OFF. Accordingly, even in the case where the W/L of the n-channel type transistor 303 is increased, a large side effect does not arise.

Note that the power source on the high potential Vdd1 and the power source on the high potential Vdd2 may be equal potentials or different potentials so long as a condition of turning OFF the transistor 301 in the case where the input terminal 202 is inputted with the input potential on the low potential side VL, that is a condition that a gate-source voltage (Vdd2-Vdd1) of the transistor 301 is larger than a threshold voltage of the transistor 301 is satisfied. In other words, any state is acceptable so long as the digital circuit 201 outputs a normal logic, or a subsequent digital circuit does not malfunction. It is generally preferable that the power source on the high potential Vdd1 and the power source on the high potential Vdd2 are equal potentials. By setting the equal potentials, the number of potentials to be supplied can be reduced, so that the number of power source circuits can be also reduced. In addition, the equal potentials can be connected to the same wiring. Consequently, a layout area can be reduced.

Note that a potential of a source terminal of the n-channel type transistor 303 and the input potential on the low potential side VL may be equal or different. Any state is acceptable so long as the digital circuit 201 outputs a normal logic, or a subsequent digital circuit does not malfunction. It is generally preferable that the potential of the source terminal of the n-channel type transistor 303 and the input potential on the low potential side VL are equal. By setting the equal potentials, the number of potentials to be supplied can be reduced, so that the number of power source circuits can be also reduced.

Described with reference to FIG. 3 is the correcting means 204 in the case where the polarity of the transistor 301 configuring the circuit element 205 to be corrected is a p-channel type. The correcting means 204 in the case where the polarity of a transistor 401 configuring the circuit element 205 to be corrected is an n-channel type is described next with reference to FIG. 4.

In this case also, it is operated so as to turn OFF the transistor 401 when it is required to be turned OFF.

Figure 4:
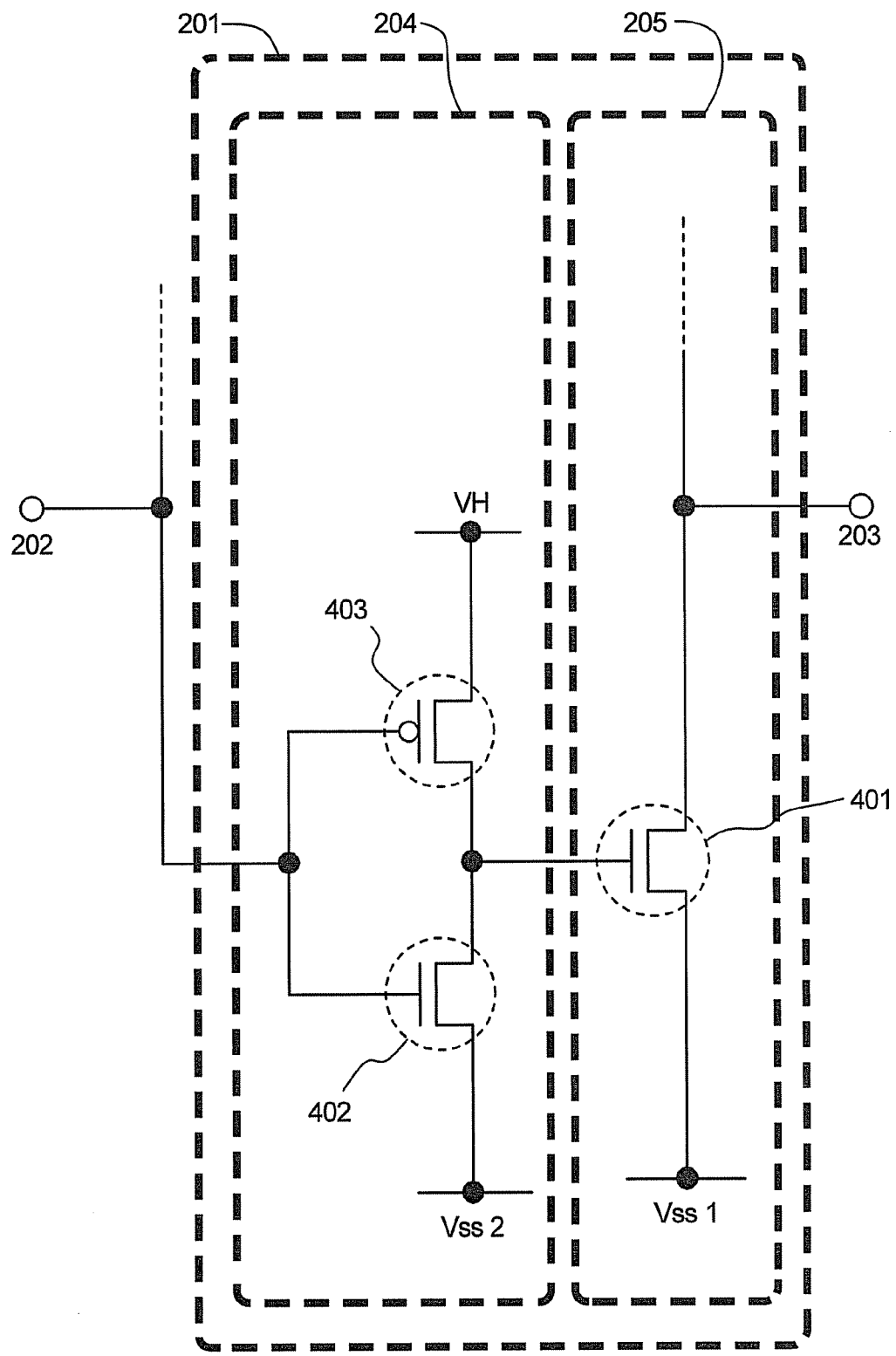
FIG. 4 is a diagram showing a configuration of a digital circuit of the invention.

In FIG. 4, the digital circuit 201 includes the correcting means 204 for correcting a potential of a signal inputted to the input terminal 202 and the circuit element 205 whose operation is controlled by an input signal corrected by the correcting means 204. Then, a signal is outputted from the output terminal 203 in accordance with the operation of the circuit element 205. The correcting means 204 is configured with an inverter circuit.

A source terminal of the transistor 401 configuring the circuit element 205 to be corrected is connected to a power source on the low potential side Vss1 and a drain terminal thereof is connected to the output terminal 203. A gate terminal of the transistor 401 is connected to an output terminal of the correcting means 204. The correcting means 204 is configured with the inverter circuit. A source terminal of a p-channel type transistor 403 configuring the inverter is connected to a potential equal to or approximately equal to the input potential on the high potential side VH. A gate terminal of the p-channel type transistor 403 is connected to the input terminal 202 and a drain terminal thereof is connected to the gate terminal of the transistor 401 as the output terminal of the correcting means 204. A source terminal of an n-channel type transistor 402 configuring the inverter is connected to a power source on the low potential side Vss2. A gate terminal of the n-channel type transistor 402 is connected to the input terminal 202 and a drain terminal thereof is connected to the gate terminal of the transistor 401 as the output terminal of the correcting means 204.

Operation of the digital circuit 201 in FIG. 4 is described next.

In the case where the input terminal 202 is inputted with the input potential on the high potential side VH, a gate-source voltage of the p-channel type transistor 403 is 0V or approximately 0V. Assuming that a threshold voltage of the p-channel type transistor 403 is 0V or less, the p-channel type transistor 403 is turned OFF in this case. On the other hand, a gate-source voltage of the n-channel type transistor 402 is applied with (VH-Vss2). The gate-source voltage (VH-Vss2) of the n-channel type transistor 402 is larger than a threshold voltage of the n-channel type transistor 402 generally, thus the n-channel type transistor 402 is turned ON. Consequently, the power source on the low potential side Vss2 is applied to the gate of the transistor 401. In this case, when a gate-source voltage of the transistor 401 (Vss2-Vss1) is smaller than a threshold voltage of the transistor 401, the transistor 401 is turned OFF. That is, in the case where the input potential on the high potential side VH is inputted to the input terminal 202, the transistor 401 is turned OFF.

In the case where the input terminal 202 is inputted with the input potential on the low potential side VL, a gate-source voltage of the p-channel type transistor 403 is (VL-VH). Therefore, (VL-VH) is smaller than a threshold voltage of the p-channel type transistor 403 generally, thus the p-channel type transistor 403 is turned ON. On the other hand, a gate-source voltage of the n-channel type transistor 402 is (VL-Vss2). In the case where (VL-Vss2) is smaller than a threshold voltage of the n-channel type transistor 402, the n-channel type transistor 402 is turned OFF. Consequently, VH is applied to the gate terminal of the transistor 401 and the transistor 401 is turned ON. That is, in the case where the input potential on the low potential side VL is inputted to the input terminal 202, the transistor 401 is turned ON to output the power source on the low potential side Vss1.

It is to be noted that in the case where the gate-source voltage (VL-Vss2) of the n-channel type transistor 402 is larger than the threshold voltage of the n-channel type transistor 402, the n-channel type transistor 402 is turned ON. The p-channel type transistor 403 is also turned ON in this case, therefore, a potential to be applied to the gate terminal of the transistor 401 is determined to be between Vss2 and VH depending on on-resistance of the n-channel type transistor 402 and the p-channel type transistor 403. In this case, the gate terminal of the transistor 401 is preferably applied with a potential that easily turns ON the transistor 401. In view of this, the on-resistance of the p-channel type transistor 403 is reduced as much as possible. Consequently, the gate terminal of the transistor 401 is applied with a potential closer to VH to turn ON the transistor 401.

As mentioned above, in the case where the input potential on the high potential side VH is inputted to the input terminal 202, the transistor 401 is turned OFF. On the other hand, in the case where the input potential on the low potential side VL is inputted to the input terminal 202, the transistor 401 is turned ON to output the power source on the low potential side Vss1. That is, the transistor 401 is turned OFF when it is required to be turned OFF while turned ON when it is required to be turned ON. Accordingly, a normal operation can be realized.

In addition, since the transistor is turned OFF when it is required to be turned OFF, the current can be prevented from continuing flowing due to a leak current. Therefore, power consumption can be reduced. Since the correcting means 204 is configured with the inverter circuit, it is necessary to be careful in that this transistor 401 is inputted with an inverted signal of an input signal.

In order to set on-resistance of the p-channel type transistor 403 less than on-resistance of the n-channel type transistor 402, the current drive capability of the p-channel type transistor 403 is preferably improved. Therefore, the W/L of the p-channel type transistor 403 is preferably increased so as to be far larger than the W/L of the n-channel type transistor 402. Specifically, the W/L of the p-channel type transistor 403 is preferably increased so as to be ten times as much as or more than ten times the W/L of the n-channel type transistor 402. Typically, a p-channel type transistor exhibits lower mobility than an n-channel type transistor, that is the current drive capability of the p-channel type transistor is lower than the n-channel type transistor. The W/L of the p-channel type transistor 403 is, therefore, preferably increased as much as possible.

In this manner, even in the case where the W/L of the p-channel type transistor 403 is increased, a large side effect does not arise. For example, in the case where the input potential on the high potential side VH is inputted to the input terminal 202, the n-channel type transistor 402 is turned ON so that the power source on the low potential side Vss2 is applied to the gate of the transistor 401. Assuming that the p-channel type transistor 403 is not turned OFF at this time, a potential higher than the power source on the low potential side Vss2 is applied to the gate of the transistor 401 because of less on-resistance of the p-channel type transistor 403, so that the transistor 401 may keep ON. However, in the case where the input potential on the high potential side VH is inputted to the input terminal 202, the p-channel type transistor 403 is turned OFF. Accordingly, even in the case where the W/L of the p-channel type transistor 403 is increased, a large side effect does not arise.

Note that the power source on the low potential side Vss1 and the power source on the low potential side Vss2 may be equal potentials or different potentials so long as a condition of turning OFF the transistor 401 in the case where the input terminal 202 is inputted with the input potential on the high potential side VH, that is a condition that a gate-source voltage (Vss2-Vss1) of the transistor 401 is smaller than a threshold voltage of the transistor 401 is satisfied. In other words, any state is acceptable so long as the digital circuit 201 outputs a normal logic, or a subsequent digital circuit does not malfunction. It is generally preferable that the power source on the low potential side Vss1 and the power source on the low potential side Vss2 are equal potentials. By setting the equal potentials, the number of potentials to be supplied can be reduced so that the number of power source circuits can be also reduced. In addition, the equal potentials can be connected to the same wiring. Consequently, a layout area can be reduced.

Note that a potential of a source terminal of the p-channel type transistor 403 and the input potential on the high potential side VH may be equal or different. Any state is acceptable so long as the digital circuit 201 outputs a normal logic, or a subsequent digital circuit does not malfunction. It is generally preferable that the potential of the source terminal of the p-channel type transistor 403 and the input potential on the high potential side VH are equal. By setting the potentials equal, the number of potentials to be supplied can be reduced, so that the number of power source circuits can be also reduced.

It is to be noted that the correcting means 204 is configured with the inverter in FIGS. 3 and 4, though it is not limited to this. The correcting means 204 may be configured with other circuits such as a NAND circuit and a NOR circuit.

In addition, a normal operation can be realized even in the case of the amplitude of the input signal smaller than the amplitude of the power source voltage according to the configurations of the invention. Therefore, an additional boosting circuit may not be provided, thus makes a contribution to the reduction in cost. Also, when a signal from an IC is supplied as an input signal to a digital circuit formed over a glass substrate, the input signal can directly be supplied to the digital circuit without using the boosting circuit.

Embodiment Mode 2

Described in this embodiment mode is a case where the invention is applied to an inverter which is one of digital circuits. Note that the logic of an output signal is inverted by applying the invention to the inverter, to be accurate. That is because a correcting means of the digital circuit is configured with the inverter. That is, an output signal is a signal outputted from the inverter in the case where an inverted signal of an input signal is inputted to the inverter. It is necessary to be careful in that 1 (H signal) is outputted without the logic inversion when 1 (H signal) is inputted as an input signal.

Figure 1:
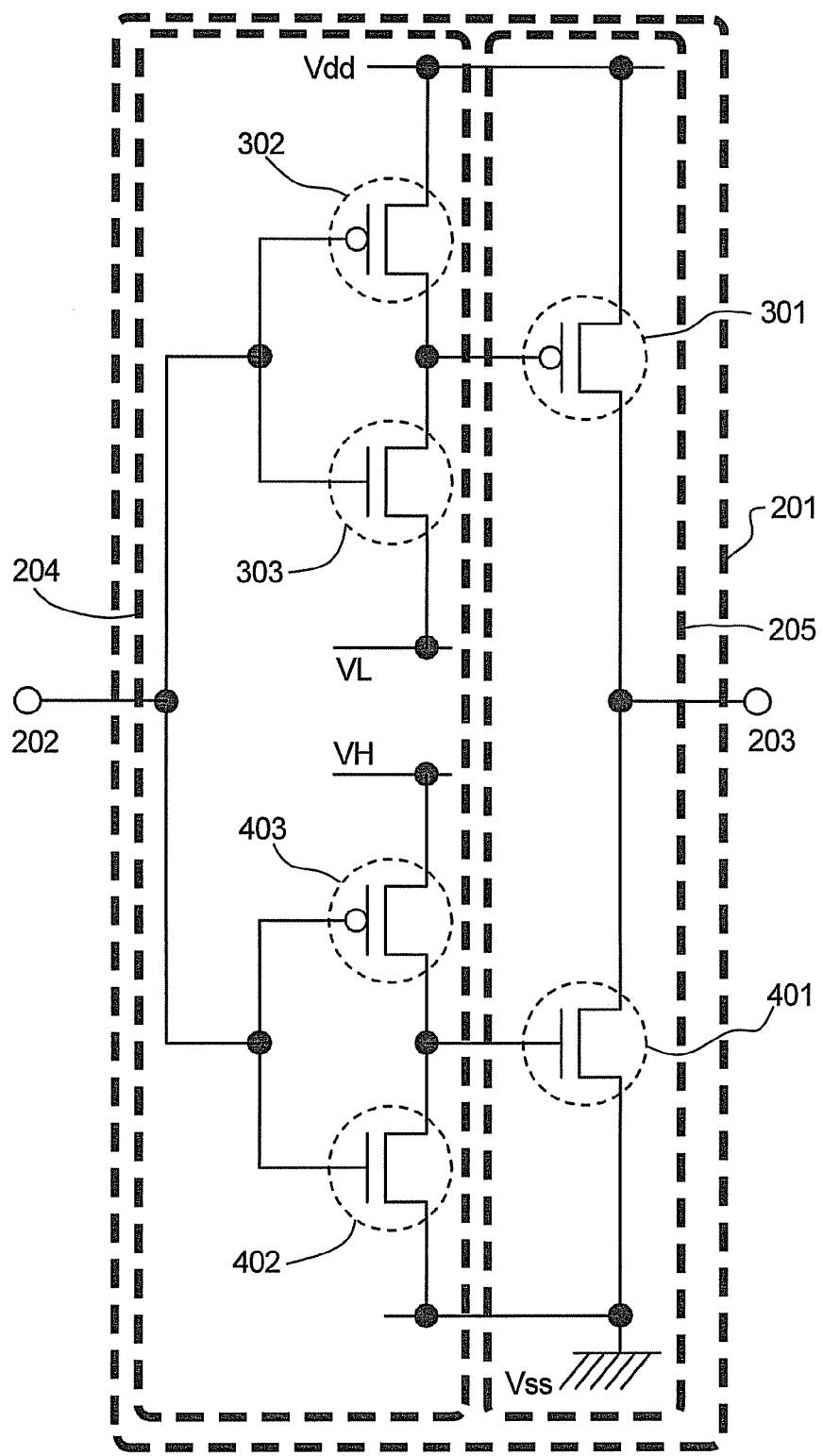
FIG. 1 is a diagram showing a circuit configuration in which the invention is applied to an inverter.
Figure 2:
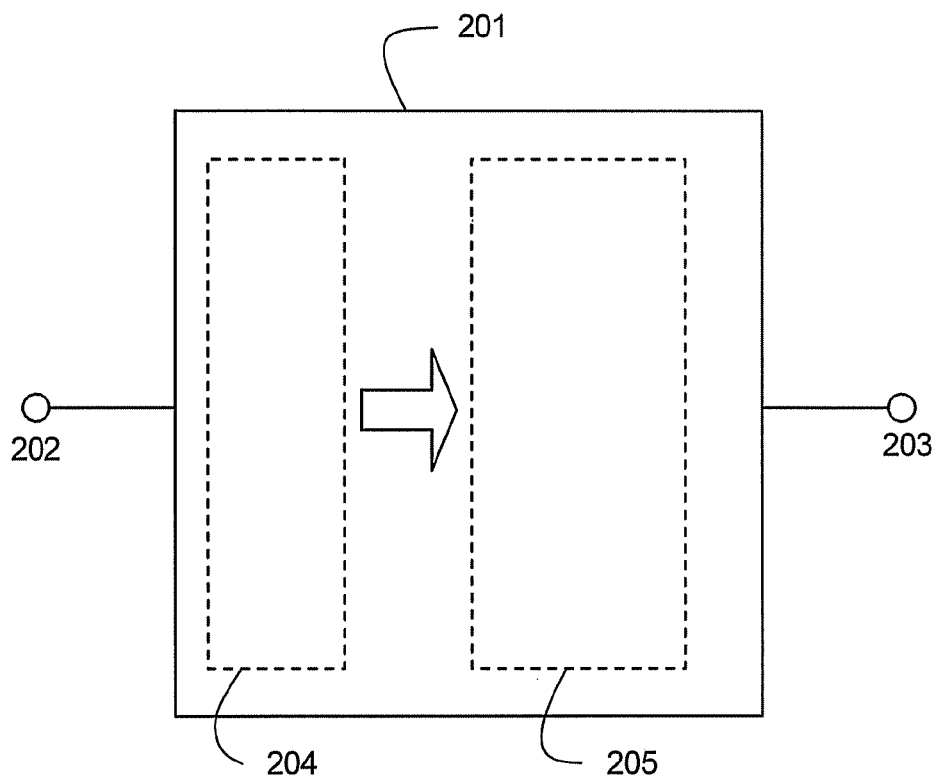
FIG. 2 is a diagram showing a configuration of a digital circuit of the invention.

FIG. 1 shows a configuration of the digital circuit 201 in which the inverter is to be corrected according to this embodiment mode. In FIG. 1, the digital circuit 201 has the correcting means 204 for correcting a potential of a signal inputted to the input terminal 202 and the circuit element 205 whose operation is controlled by the inputted signal after corrected by the correcting means 204. A signal is outputted from an output terminal 203 in accordance with the operation of the circuit element 205.

The circuit element 205 to be corrected is configured with the p-channel type transistor 301 and the n-channel type transistor 401. The correcting means 204 is divided into the portion corresponding to the p-channel type transistor 301 and the portion corresponding to the n-channel type transistor 401.

In the correcting means 204, the portion corresponding to the p-channel type transistor 301 is configured similarly to the correcting means 204 shown in FIG. 3. That is, the correcting means 204 is configured with the inverter. The inverter is configured with the n-channel type transistor 303 and the p-channel type transistor 302. In FIG. 3, the source terminal of the p-channel type transistor 302 is connected to the power source on the high potential side Vdd2. In FIG. 1, however, the power source on the high potential side is integrated into one. Therefore, the source terminal of the p-channel type transistor 302 and the source terminal of the p-channel type transistor 301 are connected to the power source on the high potential side Vdd. Note that the power source on the high potential side can be provided separately similarly to FIG. 3.

In the correcting means 204, the portion corresponding to the n-channel type transistor 401 is configured similarly to the correcting means 204 shown in FIG. 4. That is, the correcting means 204 is configured with the inverter. The inverter is configured with the p-channel type transistor 403 and the n-channel type transistor 402. In FIG. 4, the source terminal of the n-channel type transistor 402 is connected to the power source on the low potential side Vss2. In FIG. 1, however, the power source on the low potential side is integrated into one. Therefore, the source terminal of the n-channel type transistor 402 and the source terminal of the n-channel type transistor 401 are connected to the power source on the low potential side Vss. Note that the power source on the low potential side can be provided separately similarly to FIG. 4.

In this manner, the portion corresponding to the n-channel type transistor 401 is configured similarly to the correcting means 204 shown in FIG. 4 while the portion corresponding to the p-channel type transistor 301 is configured similarly to the correcting means 204 shown in FIG. 3.

Operation of the digital circuit 201 shown in FIG. 1 is described next. It is to be noted that a basic operation is the same as those in FIGS. 3 and 4, though the detailed explanation is omitted.

Firstly, the case where the input terminal 202 is inputted with 0 (L signal) is assumed. A potential thereof at that time is the input potential on the low potential side VL. The input potential on the low potential side VL is set higher than the power source on the low potential side Vss here. An operation of the p-channel type transistor 301 in this case is described. When the input potential on the low potential side VL is inputted to the input terminal 202, the p-channel type transistor 302 is turned ON while the n-channel type transistor 303 is turned OFF. Consequently, the power source on the high potential side Vdd is inputted to the gate terminal of the p-channel type transistor 301, so that the p-channel type transistor 301 is turned OFF.

Operation of the n-channel type transistor 401 is described next. In the case where the input terminal 202 is inputted with the input potential on the low potential side VL, the p-channel type transistor 403 is turned ON while the n-channel type transistor 402 is turned OFF. It is to be noted that the gate-source voltage (VL-Vss) of the n-channel type transistor 402 is larger than a threshold voltage of the n-channel type transistor 402, the n-channel type transistor 402 is turned ON. The p-channel type transistor 403 is also turned ON in this case, therefore, a potential to be applied to the gate terminal of the n-channel type transistor 401 is determined depending on on-resistance of the p-channel type transistor 403 and the n-channel type transistor 402, so that it is a potential between the input potential on the high potential side VH and the power source on the low potential side Vss. In this case, when the on-resistance of the p-channel type transistor 403 is reduced as much as possible, the gate terminal of the n-channel type transistor 401 is applied with a potential closer to the input potential on the high potential side VH. Consequently, the n-channel type transistor 401 is turned ON.

In this manner, in the case where the input terminal 202 is inputted with 0 (L signal), the p-channel type transistor 301 is turned OFF while the n-channel type transistor 401 is turned ON. Therefore, the potential of the output terminal 203 is the power source on the low potential side Vss. That is, 0 (L signal) is outputted.

Secondly, the case where the input terminal 202 is inputted with 1 (H signal) is assumed. A potential thereof is the input potential on the high potential side VH. The input potential on the high potential side VH is set lower than the power source on the high potential side Vdd here. An operation of the n-channel type transistor 401 in this case is described. When the input potential on the high potential side VH is inputted to the input terminal 202, the n-channel type transistor 402 is turned ON while the p-channel type transistor 403 is turned OFF. Consequently, the power source on the low potential side Vss is inputted to the gate terminal of the n-channel type transistor 401, so that the n-channel type transistor 401 is turned OFF.

Operation of the p-channel type transistor 301 is described next. In the case where the input terminal 202 is inputted with the input potential on the high potential side VH, the n-channel type transistor 303 is turned ON while the p-channel type transistor 302 is turned OFF. It is to be noted that when the gate-source voltage (VH-Vdd) of the p-channel type transistor 302 is smaller than a threshold voltage of the p-channel type transistor 302, the p-channel type transistor 302 is turned ON. The n-channel type transistor 303 is also turned ON in this case, therefore, a potential to be applied to the gate terminal of the p-channel type transistor 301 is determined depending on on-resistance of the p-channel type transistor 302 and the n-channel type transistor 303, so that it is a potential between the power source on the high potential side Vdd and the input potential on the low potential side VL. In this case, when the on-resistance of the n-channel type transistor 303 is reduced as much as possible, the gate terminal of the p-channel type transistor 301 is applied with a potential closer to the input potential on the low potential side VL. Consequently, the p-channel type transistor 301 is turned ON.

In this manner, in the case where the input terminal 202 is inputted with 1 (H signal), the p-channel type transistor 301 is turned ON while the n-channel type transistor 401 is turned OFF. Therefore, the potential of the output terminal 203 is the power source on the high potential side Vdd. That is, 1 (H signal) is outputted.

The normal operation can be realized even in the case where the amplitude of an input signal is smaller than the amplitude of a power source voltage. In addition, the amplitude of a signal outputted from the digital circuit 201 is approximately equal to the amplitude of the power source voltage. Therefore, in the case where another digital circuit is connected to the output terminal 203 of the digital circuit 201, a signal having the potential approximately equal to the amplitude of the power source voltage is inputted thereto so that the normal operation can be realized.

The digital circuit 201 in FIG. 1 outputs a signal having a logical value equal to that of an input signal. That is, signal logic is not inverted. For the logic inversion, therefore, a general inverter circuit is preferably connected to the output terminal 203 of the digital circuit 201.

Figure 5:
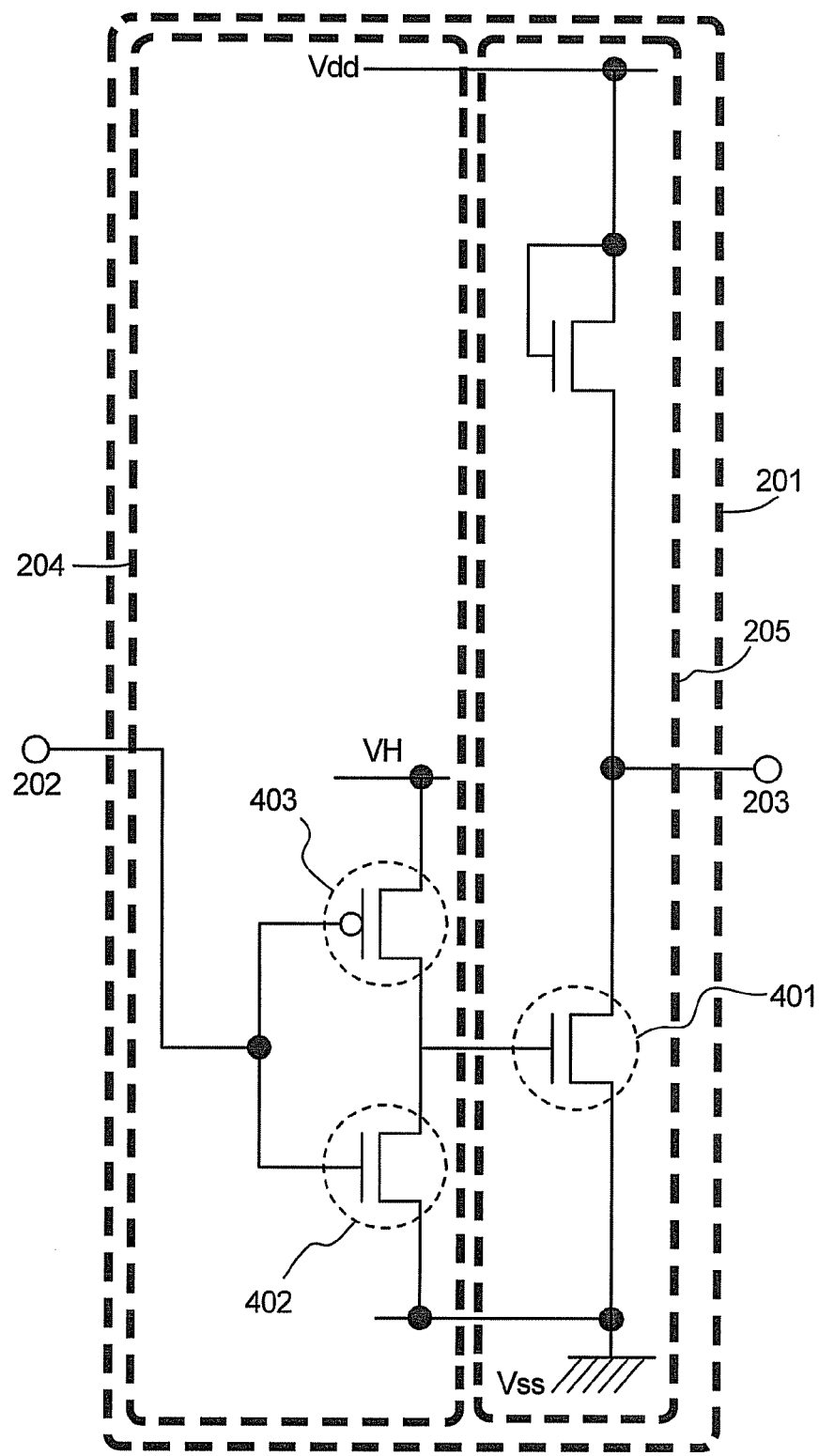
FIG. 5 is a diagram showing a circuit configuration in which the invention is applied to an inverter.
Figure 6:
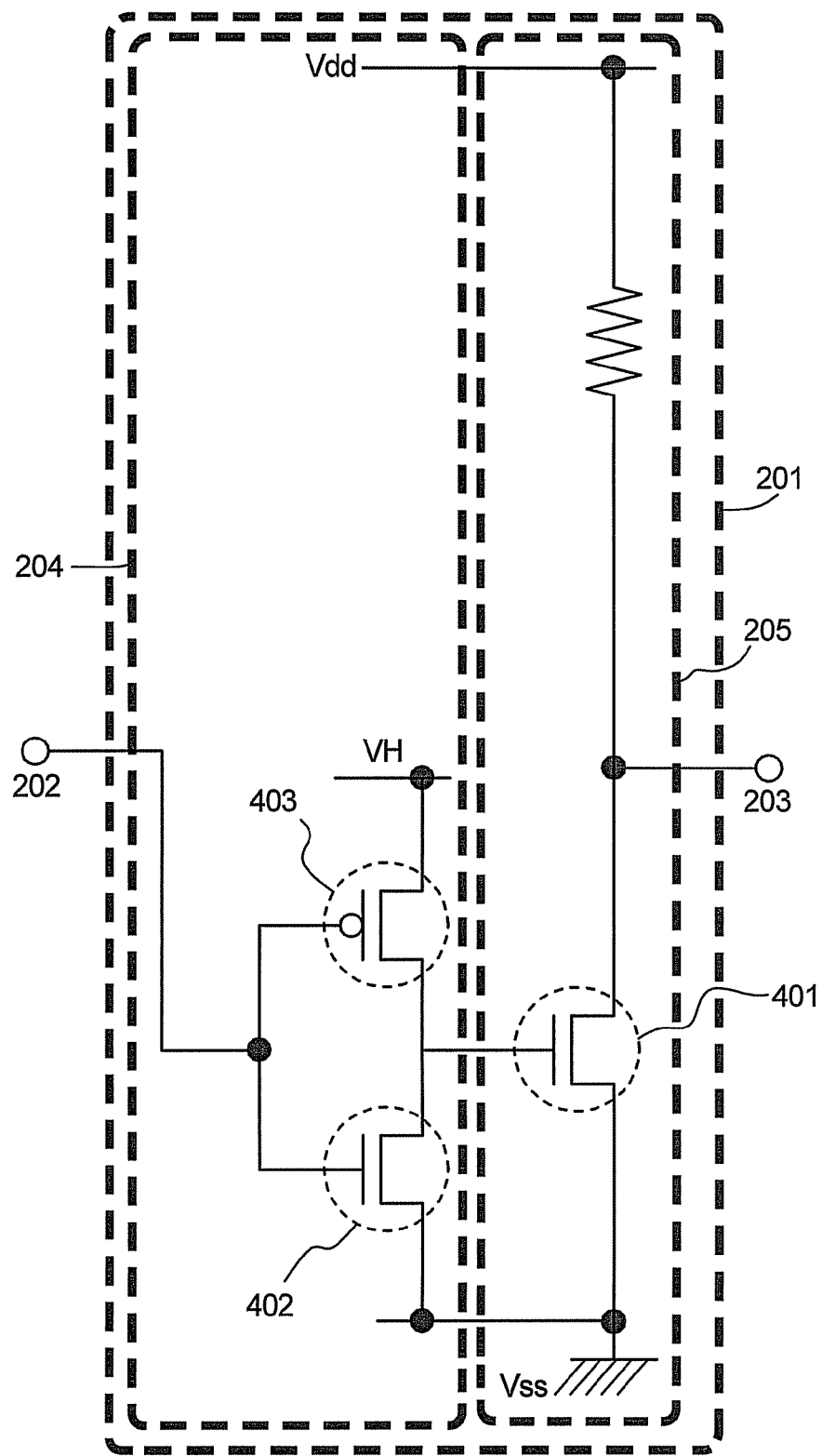
FIG. 6 is a diagram showing a circuit configuration in which the invention is applied to an inverter.

It is to be noted that FIG. 1 shows a CMOS inverter, however, the inverter may be configured such that a resistor or a diode connected transistor and the like is substituted for either the p-channel type transistor 301 or the n-channel type transistor 401. FIG. 5 shows a circuit diagram in the case where a diode connected transistor is substituted for the p-channel type transistor 301. FIG. 6 shows a circuit diagram in the case where a resistor element is substituted for the p-channel type transistor 301. In FIGS. 5 and 6, the same part as in FIG. 1 is denoted by the same numeral. The explanation of the numeral is the same as in FIG. 1, thus it is omitted. Operations in the cases of FIGS. 5 and 6 are the same as the case of FIG. 1. Note that another element is substituted for the p-channel type transistor 301 in FIGS. 5 and 6, however, another element may be substituted for the n-channel type transistor 401.

It is to be noted that the description in Embodiment Mode 1 can be applied to this embodiment mode.

Embodiment Mode 3

Described in this embodiment mode is a case where the invention is applied to a clocked inverter, which is one of digital circuits.

Figure 7:
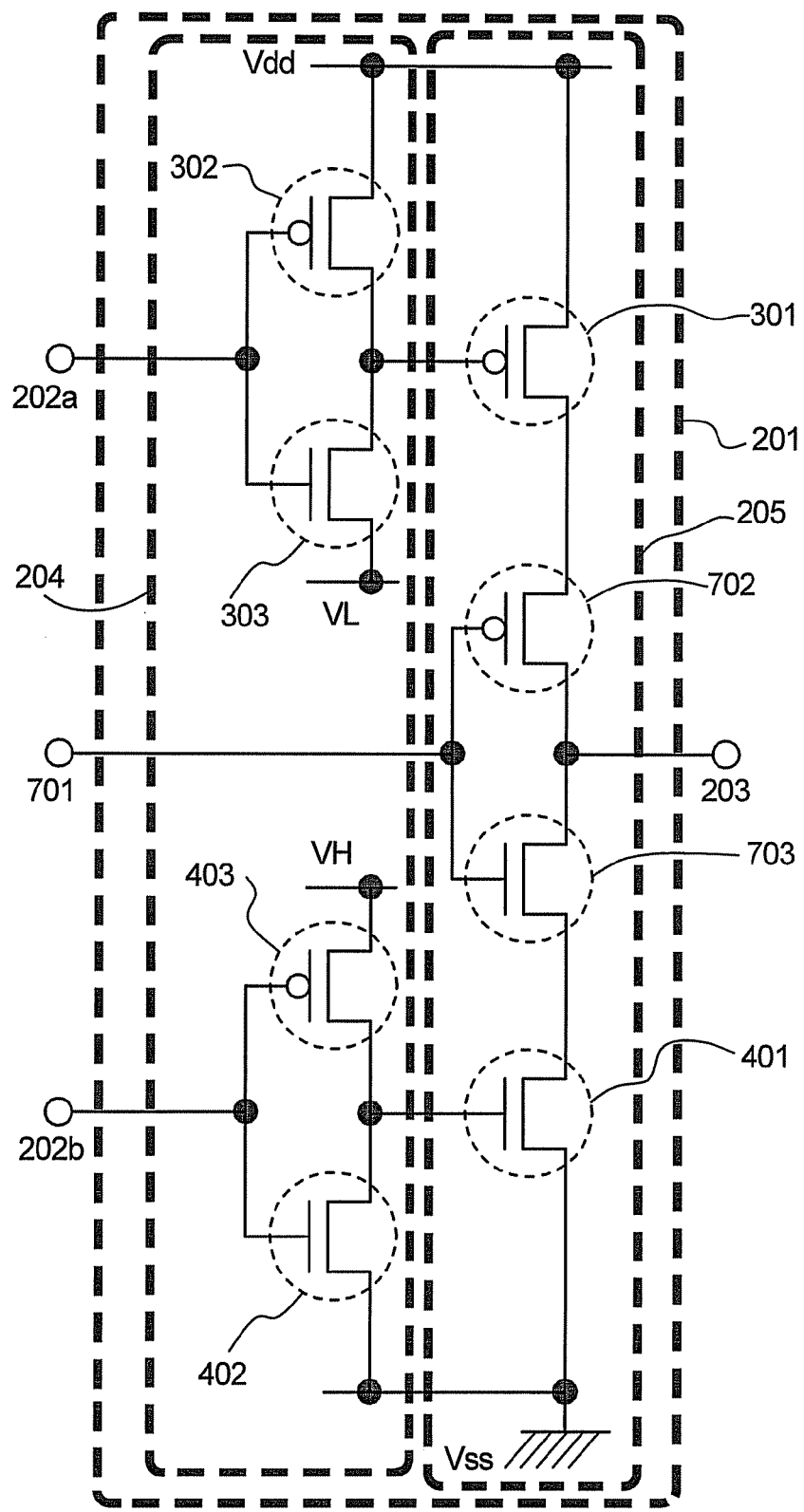
FIG. 7 is a diagram showing a circuit configuration in which the invention is applied to a clocked inverter.

FIG. 7 shows a configuration in the case where the invention is applied to a transistor for controlling whether a signal is transmitted or not, among transistors configuring the clocked inverter. In FIG. 7, the digital circuit 201 has the correcting means 204 for correcting a potential of a signal inputted to input terminals 202a and 202b and the circuit element 205 whose operation is controlled by the inputted signal after corrected by the correcting means 204. A signal is outputted from an output terminal 203 in accordance with the operation of the circuit element 205.

The clocked inverter that is the circuit element 205 to be corrected is configured with transistors 301, 401, 702, and 703. The correcting means 204 is configured with transistors 302, 303, 402, and 403.

Synchronized signals are inputted to the transistors 301 and 401. That is, the transistors 301 and 401 control whether a signal inputted from an input terminal 701 is outputted to the output terminal 203 or not. Therefore, the transistor 301 and the transistor 401 are turned ON simultaneously and turned OFF simultaneously. FIG. 7 shows the case where the signal amplitude of the synchronized signal is smaller than the amplitude of the power source voltage. The input terminals 202a and 202b for the synchronized signal are inputted with a signal having the potential VH or VL. Then, even when the signal amplitude of the synchronized signal is smaller than the amplitude of the power source voltage, an appropriate signal is inputted to the transistors 301 and 401 by the correcting means 204. The explanation of the detailed operation is omitted since it is the same as the cases in Embodiment Modes 1 and 2.

The input terminal 202a and the input terminal 202b are inputted with signals having opposite potentials to each other. For example, the terminal 202a is inputted with the potential VH as 1 (H signal) while the terminal 202b is inputted with the potential VL as 0 (L signal).

The transistors 702 and 703 are inputted with a data signal from the input terminal 701. The amplitude of this data signal is assumed to be equal to the amplitude of the power source voltage. Then, a signal is outputted to the output terminal 203 in accordance with ON/OFF of the transistors 301 and 401.

It is to be noted that the transistor 401 is disposed between the transistor 703 and the power source on the low potential side Vss, however, it is not limited to this. The transistor 703 may be disposed between the transistor 401 and the power source on the low potential side Vss.

Similarly, the transistor 301 is disposed between the transistor 702 and the power source on the high potential side Vdd, however, it is not limited to this. The transistor 702 may be disposed between the transistor 301 and the power source on the high potential side Vdd.

The logic of signals inputted from the input terminals 202a and 202b for the synchronized signal is inverted by means of the correcting means 204. It is necessary to be careful in that ON/OFF of the transistors 301 and 401 are reversed consequently.

Figure 8:
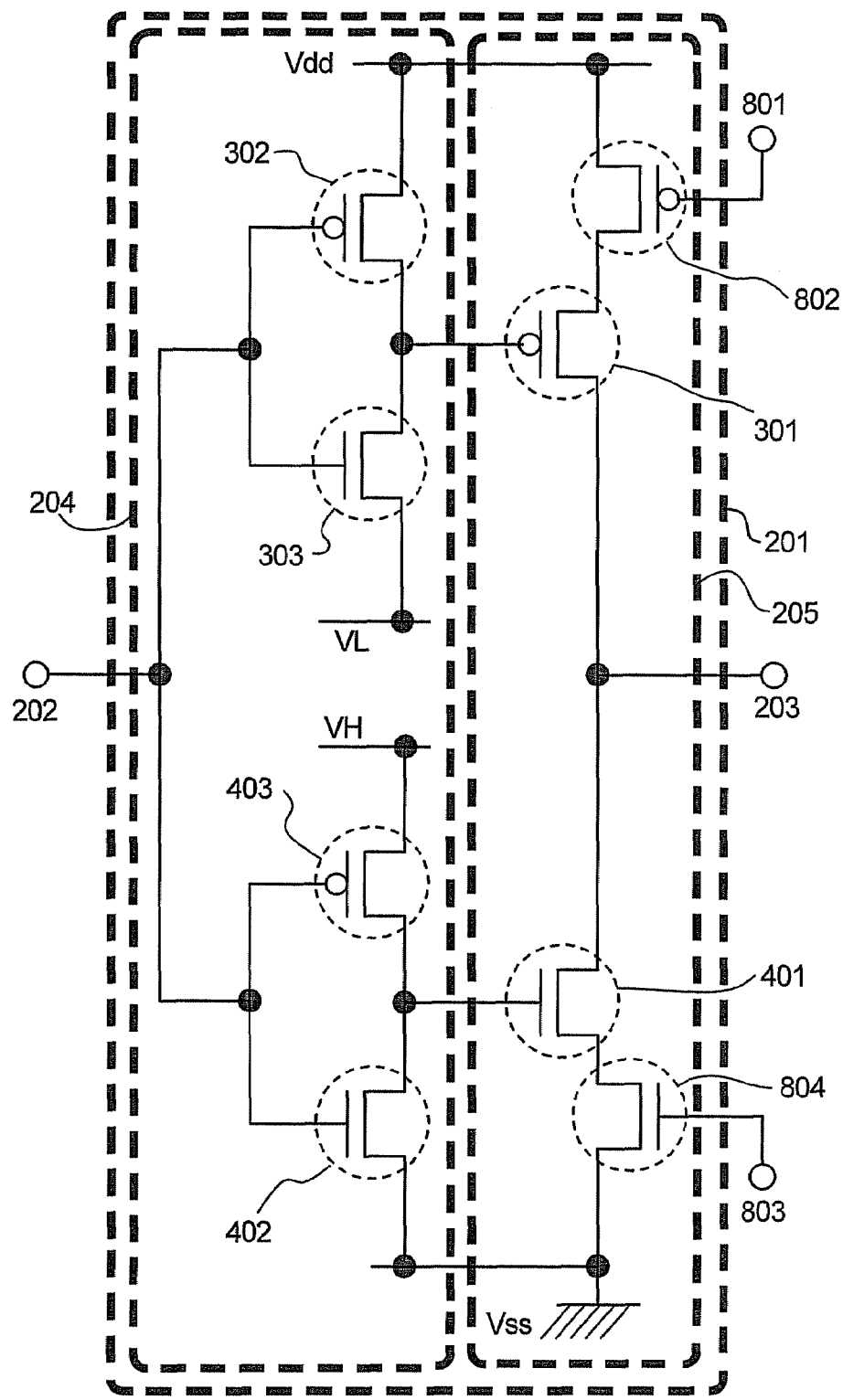
FIG. 8 is a diagram showing a circuit configuration in which the invention is applied to a clocked inverter.

FIG. 8 shows a configuration in the case where the invention is applied to a transistor for inputting a data signal, among transistors configuring the clocked inverter. In FIG. 8, the digital circuit 201 has the correcting means 204 for correcting a potential of a signal inputted to the input terminal 202 and the circuit element 205 whose operation is controlled by the inputted signal after corrected by the correcting means 204. A signal is outputted from the output terminal 203 in accordance with the operation of the circuit element 205.

The clocked inverter that is the circuit element 205 to be corrected is configured with transistors 301, 401, 802, and 804. The correcting means 204 is configured with transistors 302, 303, 402, and 403.

Synchronized signals are inputted to the transistors 802 and 804 from input terminals 801 and 803 for the synchronized signal. The signal amplitude of the synchronized signal is assumed to be equal to the amplitude of the power source voltage. It is to be noted that the transistor 802 and the transistor 804 are turned ON simultaneously and turned OFF simultaneously, thereby whether a signal inputted from the input terminal 202 is outputted to the output terminal 203 or not is controlled. Therefore, the conductivity types of the transistor 802 and the transistor 804 are reverse to each other, so that the synchronized signals thereof are reverse to each other.

On the other hand, the transistors 301 and 401 are inputted with a data signal from the input terminal 202. FIG. 8 shows the case where the signal amplitude of the data signal is smaller than the amplitude of the power source voltage. The input terminal 202 for the data signal is inputted with a signal having the potential VH or VL. Then, even when the signal amplitude of the data signal is smaller than the amplitude of the power source voltage, an appropriate signal is inputted to the transistors 301 and 401 by the correcting means 204. The explanation of the detailed operation is omitted since it is the same as the cases in Embodiment Modes 1 and 2.

It is to be noted that the transistor 804 is disposed between the transistor 401 and the power source on the low potential side Vss, however, it is not limited to this. The transistor 401 may be disposed between the transistor 804 and the power source on the low potential side Vss.

Similarly, the transistor 802 is disposed between the transistor 301 and the power source on the high potential side Vdd, however, it is not limited to this. The transistor 301 may be disposed between the transistor 802 and the power source on the high potential side Vdd.

The logic of the signal inputted from the input terminal 202 for the data signal is inverted by the correcting means 204. It is necessary to be careful in that the output terminal 203 outputs a signal having the same logic as the one of a signal inputted from the input terminal 202 consequently.

The correcting means 204 is applied to the part for controlling the synchrononism in FIG. 7 while the correcting means 204 is applied to the part for controlling data in FIG. 8, however it is not limited to this. The correcting means 204 may be applied to both of the parts.

In this manner, the part corresponding to the n-channel type transistor 401 is preferably configured similarly to the correcting means 204 shown in FIG. 4 and the part corresponding to the p-channel type transistor 301 is preferably configured similarly to the correcting means 204 shown in FIG. 3.

The normal operation can be realized even in the case where the amplitude of a data signal or a synchronized signal is smaller than the amplitude of a power source voltage. In addition, the amplitude of a signal outputted from the digital circuit 201 is approximately equal to the amplitude of the power source voltage. Therefore, in the case where another digital circuit is connected to the output terminal 203 of the digital circuit 201, a signal approximately equal to the amplitude of the power source voltage is inputted thereto, so that the normal operation can be realized.

It is to be noted that the description in Embodiment Modes 1 and 2 can be applied to this embodiment mode.

Embodiment Mode 4

Described in this embodiment mode is a case where the invention is applied to a NAND circuit which is one of digital circuits. To be accurate, the logic of an output signal in the case where the invention is applied to the NAND circuit differs from in the case of a typical NAND circuit. More accurately, the logic of the output signal becomes equal to that in the case of an OR circuit. That is, an output signal is a signal outputted from the NAND circuit in the case where an inverted signal of an input signal is inputted to the NAND circuit.

Figure 9:
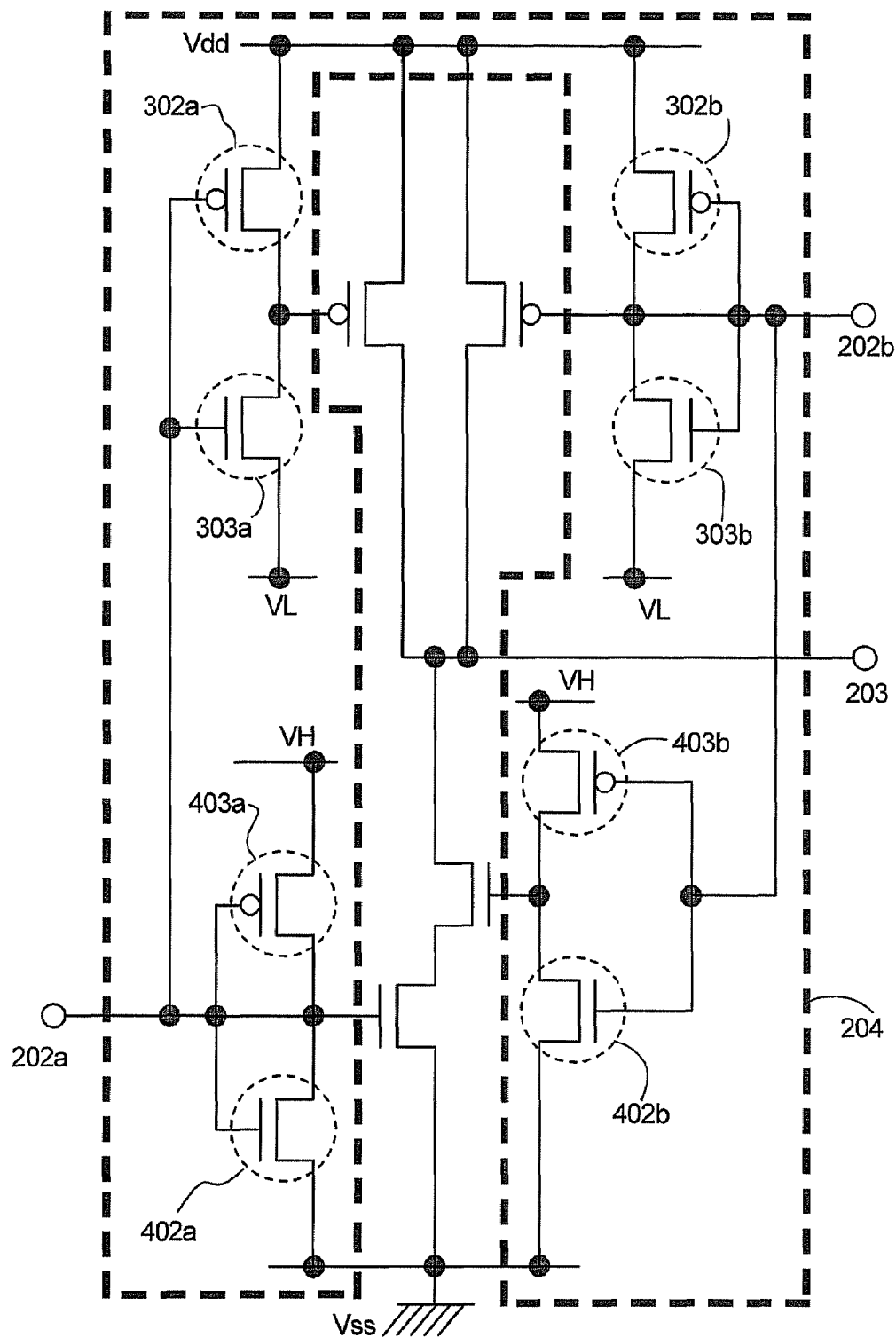
FIG. 9 is a diagram showing a circuit configuration in which the invention is applied to a NAND circuit.

FIG. 9 shows a circuit diagram in the case where the invention is applied to a NAND circuit. The correcting means 204 is configured with transistors 302a, 303a, 302b, 303b, 402a, 403a, 402b, and 403b.

As shown in FIG. 9, the part corresponding to the n-channel type transistor is preferably configured similarly to the correcting means 204 shown in FIG. 4 and the part corresponding to the p-channel type transistor is preferably configured similarly to the correcting means 204 shown in FIG. 3.

Signals inputted from the input terminals 202a and 202b are inputted to each transistor after corrected into signals of appropriate potentials by the correcting means 204. The explanation of the detailed operation is omitted since it is the same as the case in Embodiment Modes 1 and 2.

By the above configuration, the normal operation can be realized even in the case where the amplitude of an input signal is smaller than the amplitude of a power source voltage. In addition, the amplitude of a signal outputted from the digital circuit 201 is approximately equal to the amplitude of the power source voltage. Therefore, in the case where another digital circuit is connected to the output terminal 203 of the digital circuit 201, a signal approximately equal to the amplitude of the power source voltage is inputted thereto, so that the normal operation can be realized.

It is to be noted that the description in Embodiment Modes 1 and 2 can be applied to this embodiment mode.

Embodiment Mode 5

Described in this embodiment mode is a case where the invention is applied to a NOR circuit, which is one of digital circuits. To be accurate, the logic of an output signal in the case where the invention is applied to the NOR circuit differs from in the case of a typical NOR circuit. More accurately, the logic of the output signal becomes equal to that of an AND circuit. That is, an output signal is a signal outputted from the NOR circuit in the case where an inverted signal of an input signal is inputted to the NOR circuit.

Figure 10:
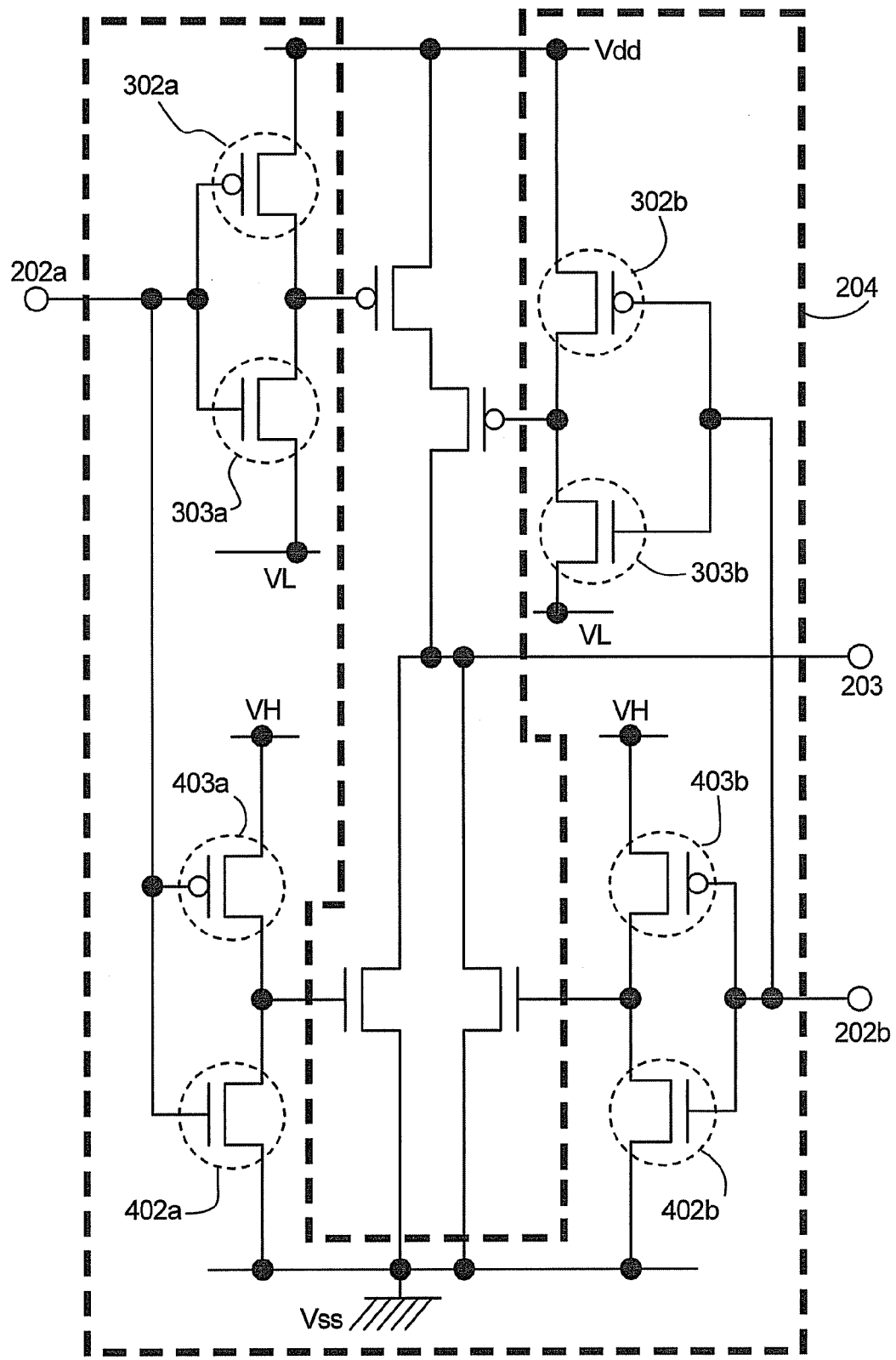
FIG. 10 is a diagram showing a circuit configuration in which the invention is applied to a NOR circuit.

FIG. 10 shows a circuit diagram in the case where the invention is applied to a NOR circuit. The correcting means 204 is configured with the transistors 302a, 303a, 302b, 303b, 402a, 403a, 402b, and 403b.

As shown in FIG. 10, the part corresponding to the n-channel type transistor is preferably configured similarly to the correcting means 204 shown in FIG. 4 and the part corresponding to the p-channel type transistor is preferably configured similarly to the correcting means 204 shown in FIG. 3.

Signals inputted from the input terminals 202a and 202b are inputted to each transistor after being corrected into signals of appropriate potentials by the correcting means 204. The explanation of the detailed operation is omitted since it is the same as the case in Embodiment Modes 1 and 2.

By the above configuration, the normal operation can be realized even in the case where the amplitude of an input signal is smaller than the amplitude of a power source voltage. In addition, the amplitude of a signal outputted from the digital circuit 201 is approximately equal to the amplitude of the power source voltage. Therefore, in the case where another digital circuit is connected to the output terminal 203 of the digital circuit 201, a signal approximately equal to the amplitude of the power source voltage is inputted thereto so that the normal operation can be realized.

It is to be noted that the description in Embodiment Modes 1 and 2 can be applied to this embodiment mode.

Embodiment

Embodiment 1

Explained in this embodiment is a configuration and an operation of a display device, a signal line driver circuit, and the like. A circuit of the invention can be applied to a part of the signal line driver circuit or a part of a gate line driver circuit.

Figure 11:
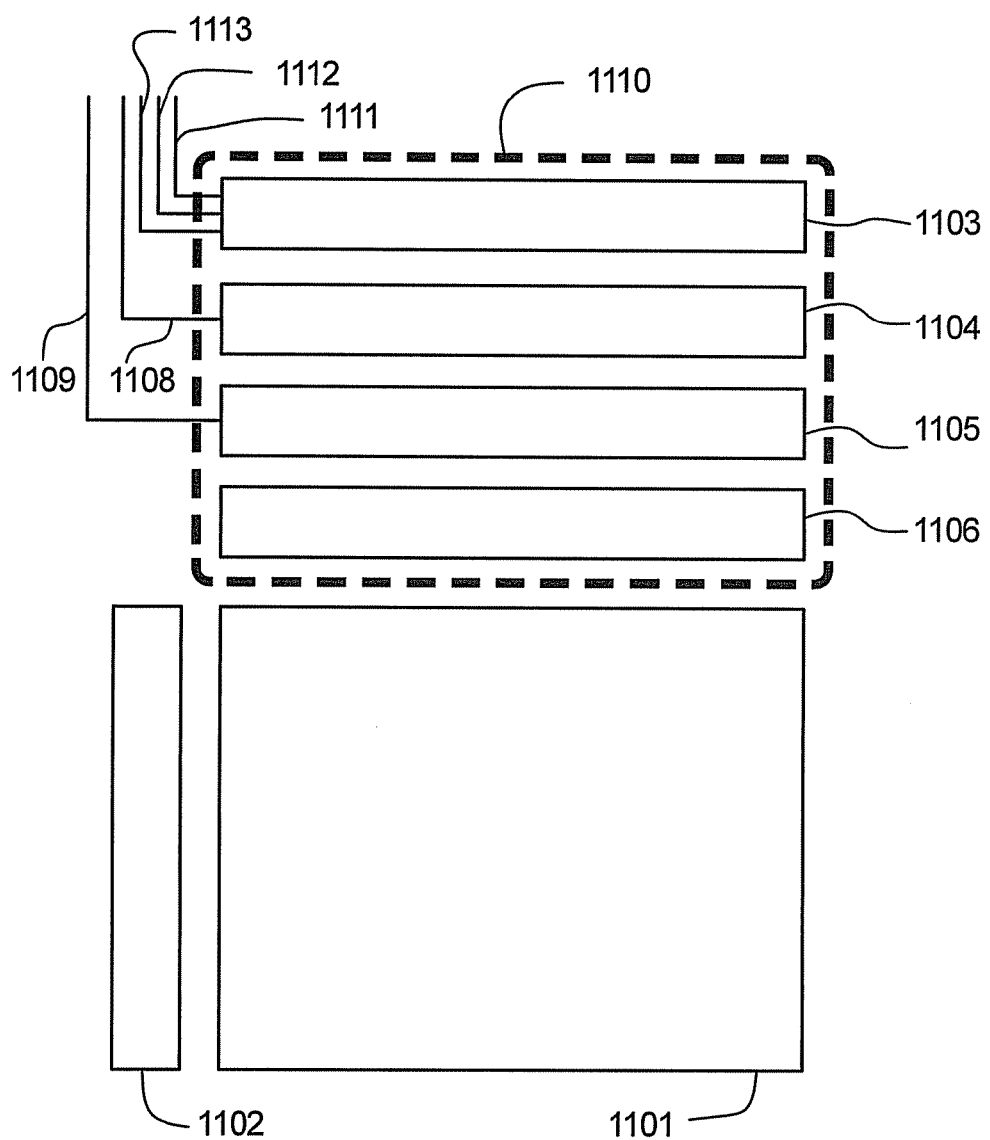
FIG. 11 is a diagram showing a configuration of a display device of the invention.

FIG. 11 shows an example of the display appliance. The display appliance includes a pixel portion 1101, a gate line driver circuit 1102, and a signal line driver circuit 1110. The gate line driver circuit 1102 sequentially outputs selection signals to the pixel portion 1101. The signal line driver circuit 1110 sequentially outputs video signals to the pixel portion 1101. In the pixel portion 1101, an image is displayed by controlling the light state in accordance with the video signal. A video signal inputted from the signal line driver circuit 1110 to the pixel portion 1101 is a voltage in many cases. That is, the state of a display element disposed in a pixel or of an element for controlling the display element is varied by a video signal (voltage) inputted from the signal line driver circuit 1110 in many cases. A video signal inputted to the pixel portion 1101 is a current in rare cases. Examples of the display element disposed in the pixel include display elements for a liquid crystal display (LCD), an organic EL (electroluminescence) display, an FED (field emission display) and the like.

It is to be noted that a plurality of the gate line driver circuits 1102 or a plurality of the signal line driver circuits 1110 may be disposed.

The signal line driver circuit 1110 is configured with a plurality of parts. Roughly speaking, it is configured with a shift register 1103, a first latch circuit (LAT1) 1104, a second latch circuit (LAT2) 1105, a digital-to-analog conversion circuit 1106 and the like.

Operation of the signal line driver circuit 1110 is described briefly. The shift register 1103 is configured with a plurality of columns of flip-flop circuits (FF) and the like. The shift register 1103 is inputted with a clock signal (S-CLK) 1112, a start pulse (SP) 1113, and a clock inverted signal (S-CLKb) 1111 are inputted and sampling pulses are outputted sequentially corresponding to the timing of these signals.

The sampling pulse outputted from the shift register 1103 is inputted to the first latch circuit 1104. The first latch circuit 1104 has been inputted with a video signal from a video signal line 1108 and corresponding to the timing of the input of the sampling pulse, the video signal is held in each column. Note that in the case where the digital-to-analog conversion circuit 1106 is disposed, the video signal takes a digital value.

When holding of video signals is completed up to the last column in the first latch circuit 1104, a latch pulse (Latch Pulse) is inputted from a latch control line 1109 during a horizontal flyback period so that the video signals held in the first latch circuit 1104 are transmitted to the second latch circuit 1105 all at once. Then, the video signals of one row held in the second latch circuit 1105 is inputted to the digital-to-analog conversion circuit 1106. A signal outputted from the digital-to-analog conversion circuit 1106 is inputted to the pixel portion 1101.

While the video signals held in the second latch circuit 1105 are inputted to the pixel portion 1101 through various circuits, the shift register 1103 outputs sampling pulses again. In other words, two operations are performed synchronously. The line sequential driving can be performed consequently. The above operations are subsequently repeated.

It is to be noted that in the case where the first latch circuit 1104 and the second latch circuit 1105 can hold an analog value, the digital-to-analog conversion circuit 1106 may be omitted. In addition, a level shift circuit, a gamma correction circuit, a voltage-to-current conversion circuit, an amplifier circuit, and the like are incorporated in the signal line driver circuit 1110 in some cases. As described above, the configuration of the signal line driver circuit 1110 is not limited to the one shown in FIG. 11 and various configurations can be employed.

On the other hand, the gate line driver circuit 1102 only serves for sequentially outputting a selection signal to the pixel portion 1101 in many cases, therefore it is configured with a shift register configured similarly to the shift register 1103 in the signal line driver circuit 1110, a level shift circuit, an amplifier circuit, and the like in many cases.

However, the configuration of the gate line driver circuit 1102 is not limited to this and various configurations can be employed.

The invention can be applied to a shift register in the signal line driver circuit 1110 or the gate line driver circuit 1102, the first latch circuit (LAT1) 1104 in the signal line driver circuit 1110, and the like.

Figure 12:
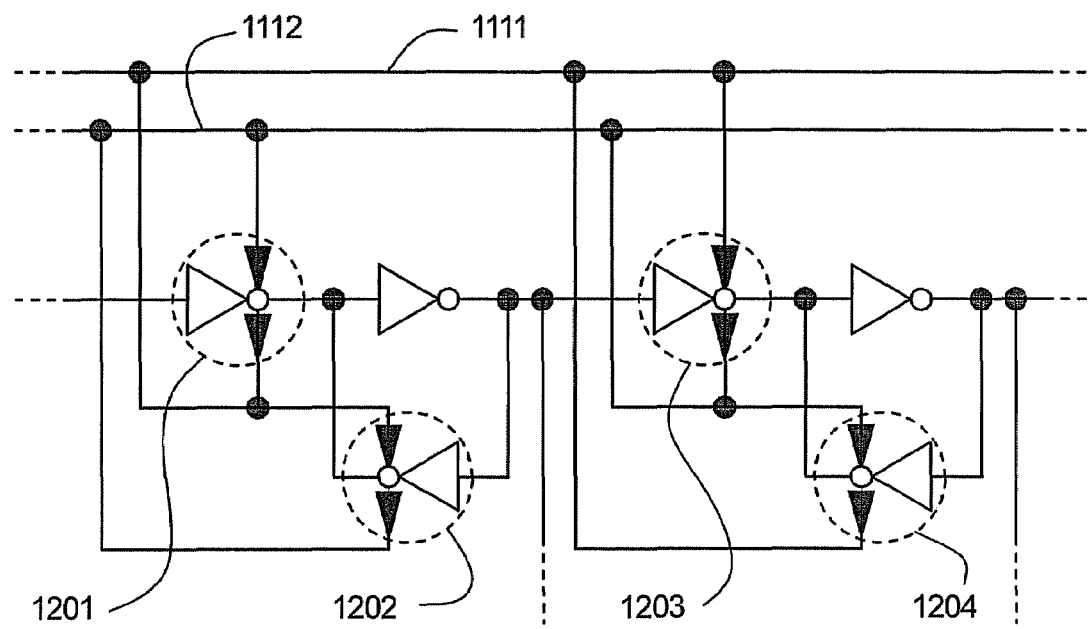
FIG. 12 is a diagram showing a configuration of a shift register of the invention.

FIG. 12 shows a part of a shift register, which is configured with inverters or clocked inverters 1201, 1202, 1203, and 1204. The shift register operates in synchronism with a clock signal (S-CLK) 1112 and a clock inverted signal (S-CLKb) 1111. It is assumed here that the amplitude of each signal of the clock signal (S-CLK) 1112 and the clock inverted signal (S-CLKb) 1111 is smaller than the amplitude of a power source voltage. In this case, the invention can be applied to the part to which a signal smaller than the amplitude of the power source voltage is inputted. In other words, the clocked inverter shown in FIG. 7 can be used for the clocked inverters 1201, 1202, 1203, and 1204. The input terminals 202a and 202b each for the synchronized signal in FIG. 7 are inputted with the clock signal (S-CLK) 1112 and the clock inverted signal (S-CLKb) 1111.

Figure 13:
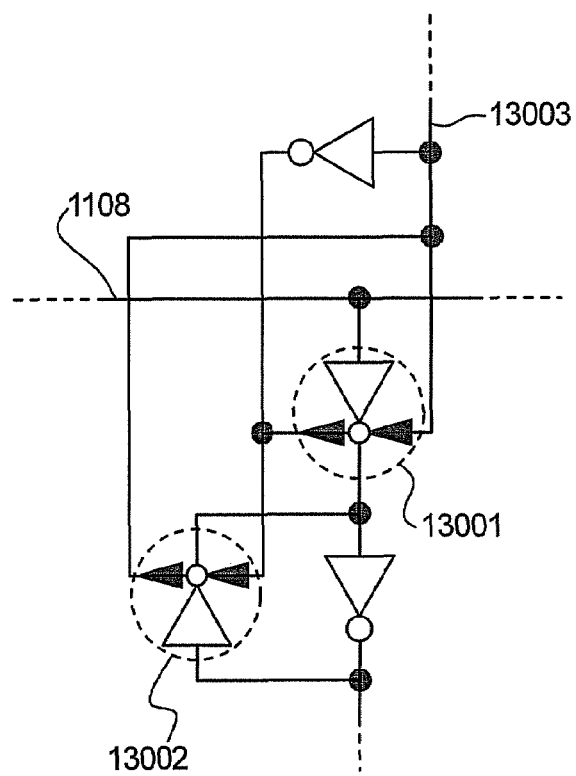
FIG. 13 is a diagram showing a configuration of a first latch circuit of the invention.

FIG. 13 shows a part of the first latch circuit (LAT1) 1104, which is configured with inverters or clocked inverters 13001 and 13002. The wiring 13003 is inputted with a sampling pulse outputted from the shift register 1103. In addition, a video signal is inputted from the video signal line 1108. In synchronism with the sampling pulse, the video signal is held in the first latch circuit (LAT1) 1104. It is assumed here that the amplitude of the video signal is smaller than the amplitude of a power source voltage. In this case, the invention can be applied to the part to which a signal smaller than the amplitude of the power source voltage is inputted. In other words, the clocked inverter shown in FIG. 8 can be used for the clocked inverter 13001. Typical circuit configuration is used for the clocked inverter 13002 since there is no part to which a signal smaller than the amplitude of the power source voltage is inputted. Therefore, the input terminals 801 and 803 each for the synchronized signal in FIG. 8 are inputted with a sampling pulse and the input terminal 202 for the data signal in FIG. 8 is inputted with a video signal from the video signal line 1108.

Note that a transistor in the invention may be any type of transistor and may be formed over any substrate. Therefore, the circuits shown in FIG. 11 may be all formed over a glass substrate, a plastic substrate, a singlecrystal substrate, an SOI substrate, or other substrates. Alternately, one part of the circuits in FIG. 11 may be formed over one substrate and another part of the circuits in FIG. 11 may be formed over another substrate. In short, all the circuits in FIG. 11 are not needed to be formed over the same substrate. For example, it is possible to form the pixel portion 1101 and the gate line driver circuit 1102 over a glass substrate using TFTs and form the signal line driver circuit 1110 (or a part of it) over a singlecrystal substrate, and then dispose the IC chip on the glass substrate with connecting by COG (Chip On Glass). Alternatively, the IC chip may be connected to the glass substrate by using TAB (Tape Automated Bonding) or a printed substrate.

Embodiment 2

Explained in this embodiment is a layout view of an inverter to which the invention is applied. A corresponding circuit diagram is shown in FIG. 1.

FIG. 14 shows a layout view of a digital circuit for correcting the inverter shown in FIG. 1. A transistor corresponds to a part where a gate insulating film is formed over a semiconductor layer 1401 formed by using polycrystalline silicon and the like and a gate wiring (first wiring) 1402 is disposed thereover. An interlayer insulating film is formed over the gate wiring (first wiring) 1402 and a second wiring 1404 is disposed thereover. The second wiring 1404 and the semiconductor layer 1401 are connected to each other by opening a contact 1403 as well as the second wiring 1404 and the gate wiring (first wiring) 1402.

In FIG. 14, the part corresponding to FIG. 1 is denoted by the same numeral. The explanation of the numeral is the same as in FIG. 1, thus it is omitted. The circuit element to be corrected is configured with the p-channel type transistor 301 and the n-channel type transistor 401. The correcting means is divided into the portion corresponding to the p-channel type transistor 301 and the portion corresponding to the n-channel type transistor. The portion corresponding to the p-channel type transistor 301 is configured with the n-channel type transistor 303 and the p-channel type transistor 302. The portion corresponding to the n-channel type transistor 401 is configured with the p-channel type transistor 403 and the n-channel type transistor 402.

Semiconductor device of the invention can be realized by using known technology with the layout view shown in FIG. 14.

Note that each gate width W of the transistor 403 and the transistor 303 is made large in FIG. 14. It brings the improvement in the current drive capability and the reduction in on-resistance of the transistor 403 and the transistor 303.

It is to be noted that this embodiment can be combined with Embodiment Modes 1 to 5, and Embodiment 1 arbitrarily.

Embodiment 3

Electronic apparatuses each using the invention include a video camera, a digital camera, a goggle type display (head mounted display), a navigation system, a sound reproducing device (a car audio equipment, an audio set, and the like), a notebook type personal computer, a game machine, a portable information terminal (a mobile computer, a portable telephone, a portable game machine, an electronic book, and the like), an image reproducing device provided with a recording medium (more specifically, a device which reproduces a recording medium such as a digital versatile disc (DVD) and so forth, and equipped with a display for displaying the reproduced image), or the like. Specific examples of these electronic apparatuses are shown in FIG. 15.

Figure 15A:
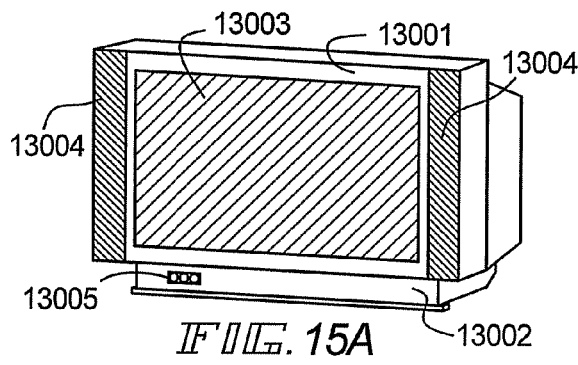
FIGS. 15(A)-15(H) show views of electronic apparatuses to which the invention is applied.

FIG. 15A is a light emitting device including a housing 13001, a supporting stand 13002, a display portion 13003, a speaker portion 13004, a video input terminal 13005, and the like. The invention can be applied to an electrical circuit which configures the display portion 13003. The light emitting device shown in FIG. 15A is completed by the invention. The light emitting device is a self-luminous type, thus no backlight is required and a thinner display portion than a liquid crystal display can be realized. Note that the light emitting device refers to all display appliances for displaying information, including ones for personal computers, for TV broadcasting reception, and for advertisement.

Figure 15B:
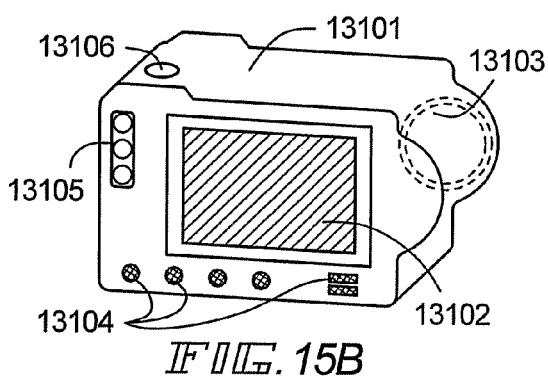

FIG. 15B is a digital still camera including a body 13101, a display portion 13102, an image receiving portion 13103, operating keys 13104, an external connecting port 13105, a shutter 13106 and the like. The invention can be applied to an electrical circuit which configures the display portion 13102. The digital still camera shown in FIG. 15B is completed by the invention.

Figure 15C:
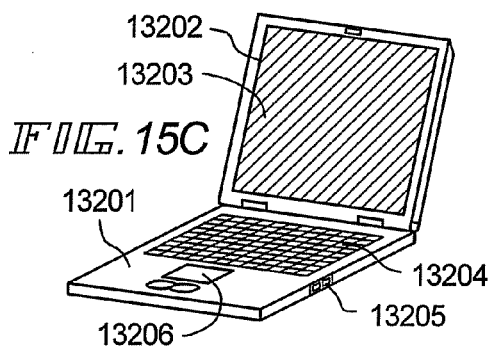

FIG. 15C is a notebook type personal computer including a body 13201, a housing 13202, a display portion 13203, a keyboard 13204, an external connecting port 13205, a pointing mouse 13206 and the like. The invention can be applied to an electrical circuit which configures the display portion 13203. The notebook type personal computer shown in FIG. 15C is completed by the invention.

Figure 15D:
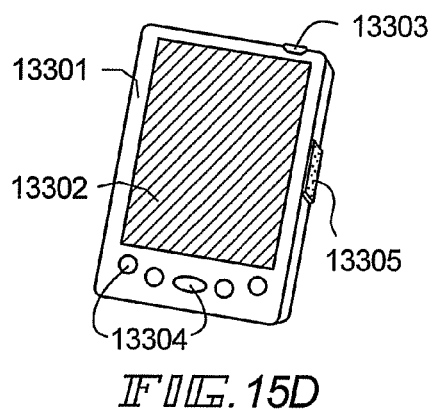

FIG. 15D is a mobile computer including a body 13301, a display portion 13302, a switch 13303, operating keys 13304, an infrared port 13305, and the like. The invention can be applied to an electrical circuit which configures the display portion 13302. The mobile computer shown in FIG. 15D is completed by the invention.

Figure 15E:
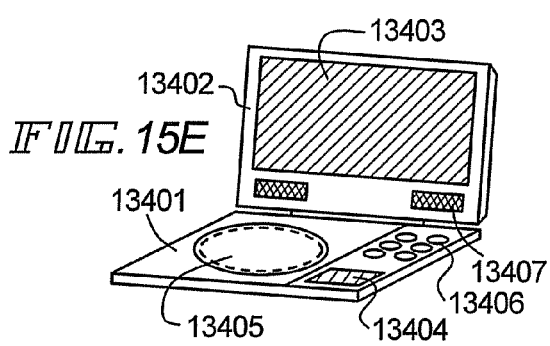

FIG. 15E is a portable image reproducing device (specifically a DVD reproducing device) provided with a recording medium, including a body 13401, a housing 13402, a display portion A 13403, a display portion B 13404, a recording medium (such as DVD) reading portion 13405, an operating key 13406, a speaker portion 13407 and the like. The display portion A 13403 mainly displays image data while the display portion B 13404 mainly displays text data. The invention can be applied to electrical circuits which configure both of the display portions A, B 13403 and 13404. Note that the image reproducing devices provided with a recording medium includes a home game machine and the like. The DVD reproducing device shown in FIG. 15E is completed by the invention.

Figure 15F:
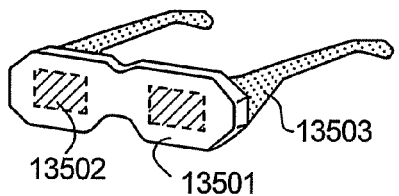

FIG. 15F is a goggle type display (head mounted display) including a body 13501, a display portion 13502, and an arm portion 13503. The invention can be applied to an electrical circuit which configures the display portion 13502. The goggle type display shown in FIG. 15F is completed by the invention.

Figure 15G:
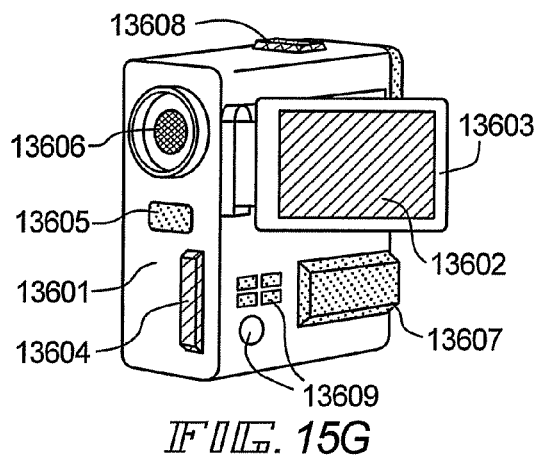

FIG. 15G is a video camera including a body 13601, a display portion 13602, a housing 13603, an external connecting port 13604, a remote control receiving portion 13605, an image receiving portion 13606, a battery 13607, an audio input portion 13608, an operating key 13609 and the like. The invention can be applied to an electrical circuit which configures the display portion 13602. The video camera shown in FIG. 15G is completed by the invention.

Figure 15H:
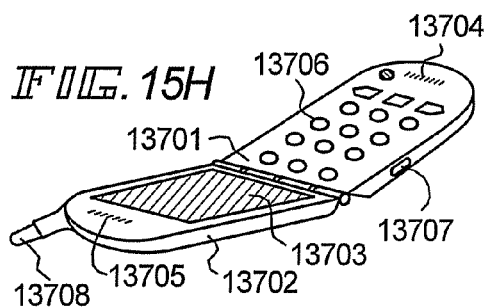
Figure 16A:
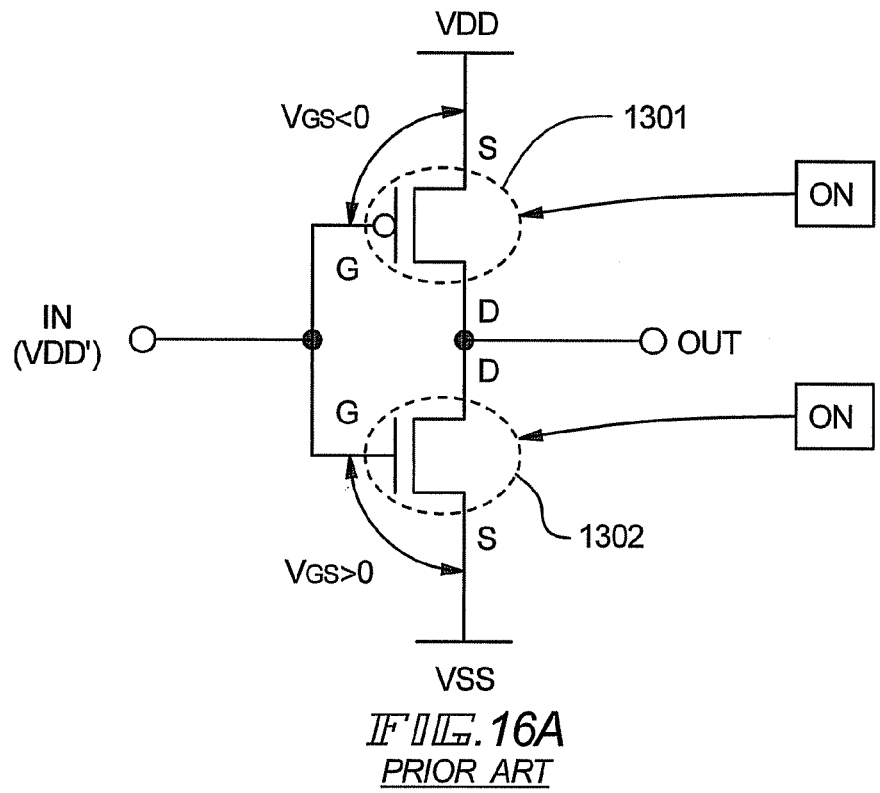
FIGS. 16(A)-16(B) are diagrams showing a configuration of a typical inverter and the states of malfunctions of the inverter when a potential of an input signal is not the desired level.
Figure 16B:
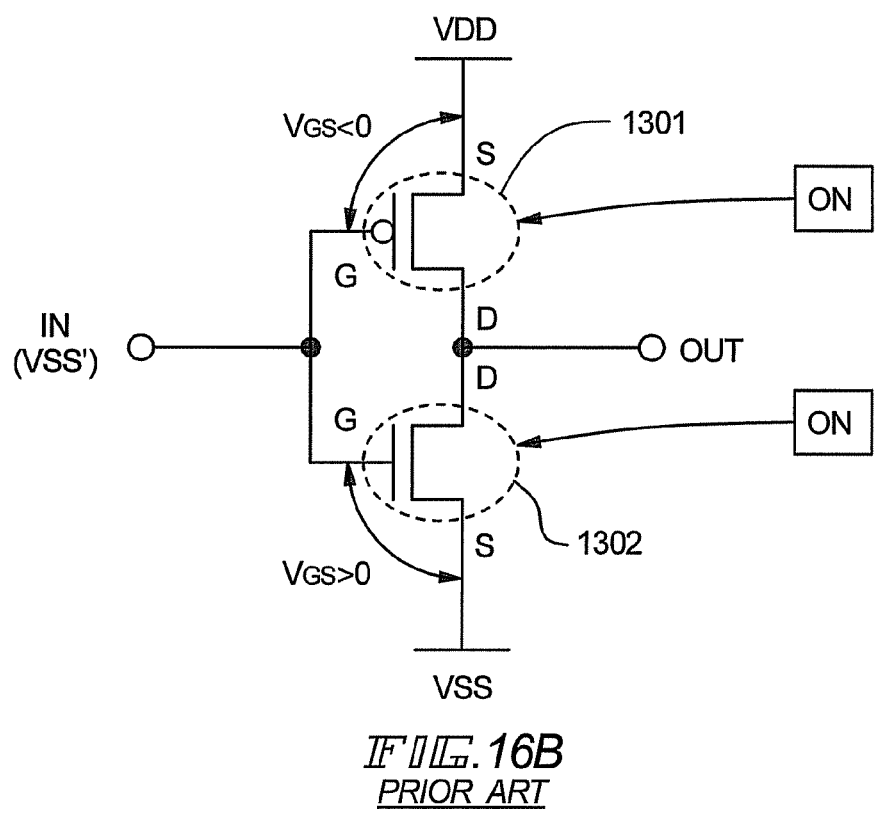

FIG. 15H is a portable phone including a body 13701, a housing 13702, a display portion 13703, an audio input portion 13704, an audio output portion 13705, an operating key 13706, an external connecting port 13707, an antenna 13708 and the like. The invention can be applied to an electrical circuit which configures the display portion 13703. Note that current consumption of the portable phone can be suppressed by displaying white text on a black background in the display portion 13703. The portable phone shown in FIG. 15H is completed by the invention.

Provided that a light emission luminance of a light emitting material becomes high in the future, the light including outputted image data can be expanded and projected by a lens and the like to be used for a front or rear projector.

Furthermore, the aforementioned electronic apparatuses are becoming to be used for displaying information distributed through a telecommunication path such as Internet, a CATV (cable television system), and in particular for displaying moving picture information. The light emitting device is suitable for displaying moving pictures since the light emitting material exhibits high response speed.

In the light emitting device, a portion that emits light consumes power. Therefore it is desirable to display information such that as small portion as possible emit light. Accordingly, if the light emitting device is used for a display portion that mainly displays text data such as a portable information terminal, in particular, a portable phone or an audio reproducing device, it is desirable to drive so as to assign light emitting portions to display text data while portions that do not emit light serve as the background.

As described above, the application range of the invention is so wide that the invention can be applied to electronic apparatuses of every field. For the electronic apparatuses in this embodiment mode, a semiconductor device having any of the structures shown in Embodiment Modes 1 to 5, Embodiments 1 and 2 may be used.

The invention claimed is:

1. A semiconductor device comprising:
a first transistor;
a second transistor;
a third transistor; and
a fourth transistor,
wherein:
a gate terminal of the first transistor and a gate terminal of the second transistor are electrically connected;
a drain terminal of the first transistor is electrically connected to a drain terminal of the second transistor;
the drain terminal of the first transistor is electrically connected to a gate terminal of the third transistor;
a drain terminal of the fourth transistor is electrically connected to a drain terminal of the third transistor;
the gate terminal of the first transistor is supplied with one of a first signal potential and a second signal potential;
a source terminal of the first transistor is supplied with a first power source potential;
a source terminal of the second transistor is supplied with a potential equal to the first signal potential;
a source terminal of the third transistor is supplied with a second power source potential;
a source terminal of the fourth transistor is supplied with a third power source potential;
the second signal potential is between the first power source potential and the first signal potential;
the first power source potential is equal to the second power source potential;
the third power source potential is higher than the first signal potential;
the first transistor and the third transistor are n-channel type transistors; and
the second transistor and the fourth transistor are p-channel type transistors.

2. The semiconductor device according to claim 1, wherein conductivity types of the first transistor and the second transistor are different.

3. A semiconductor device comprising:
a first transistor;
a second transistor;
a third transistor; and
a fourth transistor,
wherein:
a gate terminal of the first transistor and a gate terminal of the second transistor are electrically connected;
a drain terminal of the first transistor is electrically connected to a drain terminal of the second transistor;
the drain terminal of the first transistor is electrically connected to a gate terminal of the third transistor;
the gate terminal of the first transistor is supplied with one of a first signal potential and a second signal potential;
a source terminal of the first transistor is supplied with a first power source potential;
a source terminal of the second transistor is supplied with a potential equal to the first signal potential;
a source terminal of the third transistor is supplied with a second power source potential;
the first transistor and the third transistor are p-channel type transistors;
the second transistor and the fourth transistor are n-channel type transistors;
the first signal potential is lower than the second signal potential;
the second signal potential is lower tan the first power source potential;
the first power source potential is equal to the second power source potential;
a source terminal of the fourth transistor is supplied with a third power source potential;
a drain terminal of the fourth transistor is electrically connected to a drain terminal of the third transistor; and
the third power source potential is lower than the first signal potential.

4. A display appliance comprising the semiconductor device according to any one of claims 1 to 3.

5. An electronic apparatus comprising the display appliance according to claim 4.

6. A semiconductor device according to claim 3, wherein the first power source potential and the second power source potential are power source potentials on a high potential side.

7. A semiconductor device comprising first to sixth transistors,
wherein gate terminals of the first to fourth transistors are electrically connected to each other,
wherein a drain terminal of the first transistor is electrically connected to a drain terminal of the second transistor,
wherein a drain terminal of the third transistor is electrically connected to a drain terminal of the fourth transistor,
wherein a gate terminal of the fifth transistor is electrically connected to the drain terminal of the first transistor,
wherein a gate terminal of the sixth transistor is electrically connected to the drain terminal of the third transistor,
wherein a drain terminal of the fifth transistor is electrically connected to a drain terminal of the sixth transistor,
wherein the first transistor, the third transistor and the fifth transistor are p-channel type transistors,
wherein the second transistor, the fourth transistor and the sixth transistor are n-channel type transistors,
wherein one of a first signal potential and a second signal potential is inputted to the gate terminals of the first to fourth transistors,
wherein the first signal potential is supplied to a source terminal of the second transistor,
wherein the second signal potential is supplied to a source terminal of the third transistor, wherein the first signal potential is lower than the second signal potential, wherein a source terminal of the first transistor is supplied with a first power source potential, wherein a source terminal of the fourth transistor is supplied with a second power source potential, wherein the first signal potential is higher than the second power source potential, and wherein the second signal potential is lower than the first power source potential.

8. A semiconductor device according to claim 7, wherein a source terminal of the first transistor is electrically connected to a source terminal of the fifth transistor.

9. A semiconductor device according to claim 7, wherein a source terminal of the fourth transistor is electrically connected to a source terminal of the sixth transistor.

10. A semiconductor device comprising first to sixth transistors, wherein a gate terminal of the first transistor is electrically connected to a gate terminal of the second transistor, wherein a gate terminal of the third transistor is electrically connected to a gate terminal of the fourth transistor, wherein a drain terminal of the first transistor is electrically connected to a drain terminal of the second transistor, wherein a drain terminal of the third transistor is electrically connected to a drain terminal of the fourth transistor, wherein a gate terminal of the fifth transistor is electrically connected to the drain terminal of the first transistor, wherein a gate terminal of the sixth transistor is electrically connected to the drain terminal of the third transistor, wherein a drain terminal of the fifth transistor is electrically connected to a drain terminal of the sixth transistor, wherein the first transistor, the third transistor and the fifth transistor are p-channel type transistors, wherein the second transistor, the fourth transistor and the sixth transistor are n-channel type transistors, wherein a first potential is supplied to a source terminal of the first transistor, wherein a second potential is supplied to a source terminal of the second transistor, wherein a third potential is supplied to a source terminal of the third transistor, wherein fourth potential is supplied to a source terminal of the fourth transistor, wherein the first potential is higher than the third potential, and wherein the second potential is higher than the fourth potential.

11. A semiconductor device according to claim 10, wherein the third potential is higher than the second potential.

12. A semiconductor device according to claim 10, wherein the gate terminal of the first transistor is electrically connected to the gate terminal of the third transistor.

13. A semiconductor device according to claim 10, wherein the first potential is supplied to a source terminal of the fifth transistor, and the fourth potential is supplied to a source terminal of the sixth transistor.

14. A semiconductor device according to claim 10, wherein one of the second potential and the third potential is supplied to the gate terminals of the first to fourth transistors.

* * * * *